United States Patent [19]

Kreuzer et al.

[11] 4,335,313
[45] Jun. 15, 1982

[54] METHOD AND APPARATUS FOR ALIGNING AN OPAQUE MASK WITH AN INTEGRATED CIRCUIT WAFER

[75] Inventors: Justin L. Kreuzer, Trumbull; David H. Kittell, Stamford, both of Conn.

[73] Assignee: The Perkin-Elmer Corporation, Norwalk, Conn.

[21] Appl. No.: 149,106

[22] Filed: May 12, 1980

[51] Int. Cl.³ .................... G01N 21/00; G01N 23/00
[52] U.S. Cl. ................................. 250/491; 250/492.2
[58] Field of Search ............... 250/492 A, 491, 398, 250/451, 456

[56] References Cited
U.S. PATENT DOCUMENTS

| | | | |
|---|---|---|---|
| 3,648,048 | 3/1972 | Cahan et al. | 250/492 A |
| 3,683,195 | 8/1972 | Johannsmeier et al. | 250/492 A |
| 3,742,229 | 6/1973 | Smith et al. | 250/492 A |
| 3,745,358 | 7/1973 | Firtz et al. | 250/492 A |
| 3,843,916 | 10/1974 | Trotel et al. | 250/492 A |

Primary Examiner—Bruce C. Anderson
Attorney, Agent, or Firm—S. A. Giarratana; E. T. Grimes; T. P. Murphy

[57] ABSTRACT

There are disclosed method and apparatus for precisely aligning the pattern of an opaque mask with a previously exposed pattern on a silicon wafer. Three separate optical channels are aligned so that their axes coincide with three targets on the wafer. The objectives are also adjusted to the same vertical distance from the wafer. Thereafter, the optical channels remain fixed. The wafer is retracted a short distance and is replaced by the mask which also has three targets. The mask is then shifted to align the targets with the prealigned optical axes. When mask alignment is completed, the mask and the wafer are removed as a unit to an exposure station.

13 Claims, 35 Drawing Figures

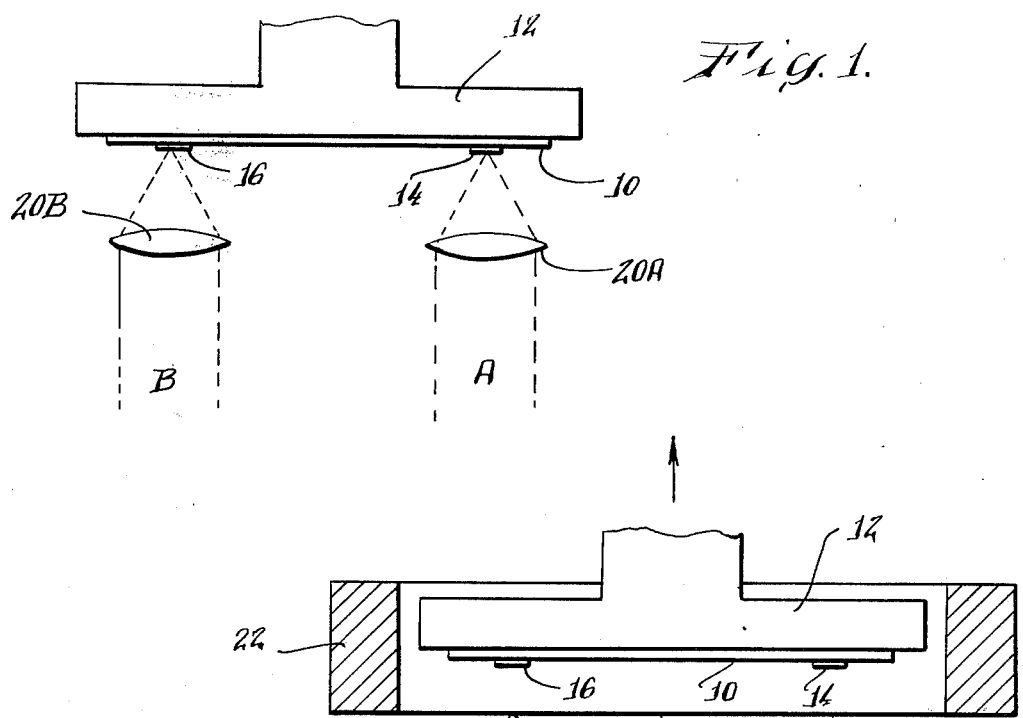
Fig. 1.
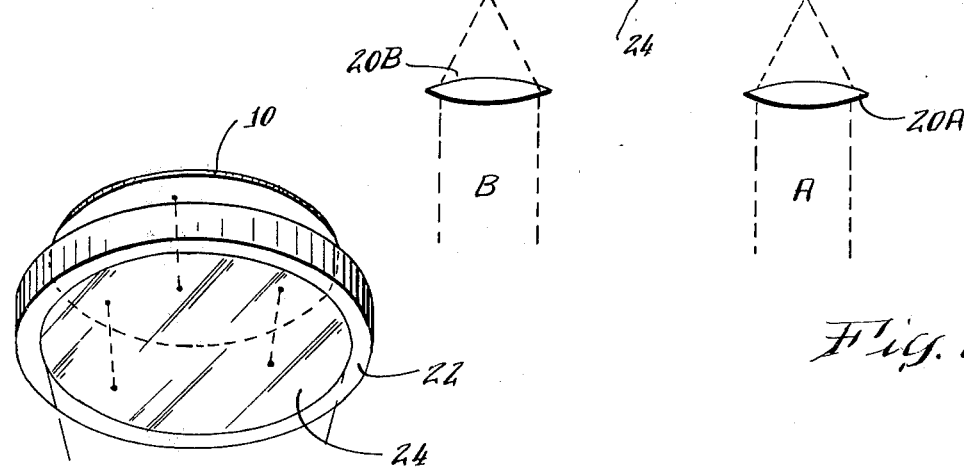
Fig. 2.
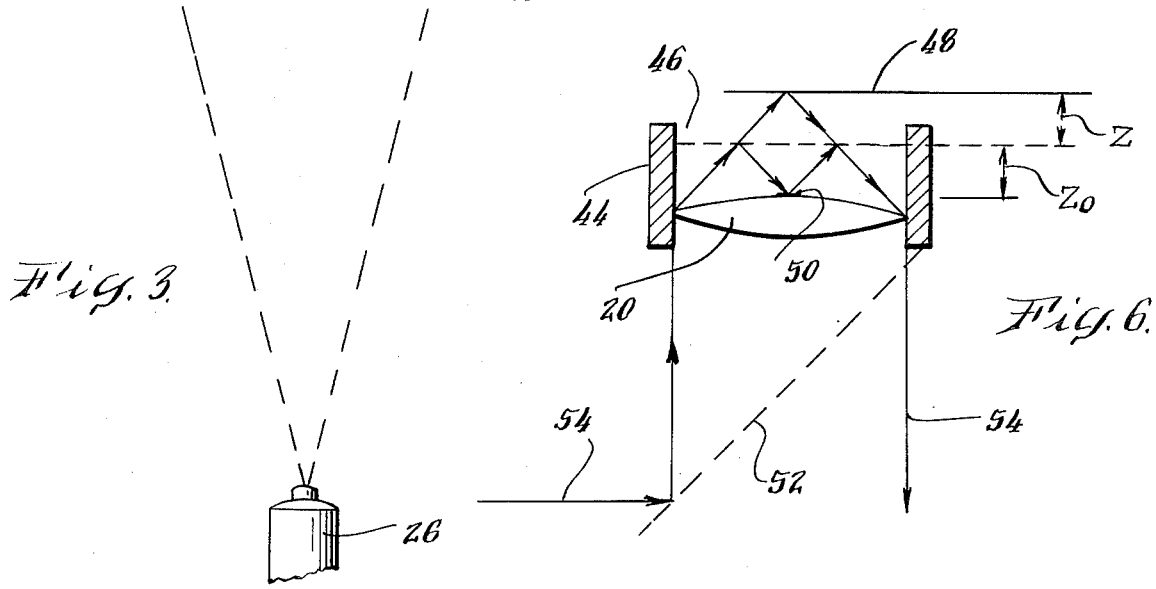
Fig. 3.
Fig. 6.

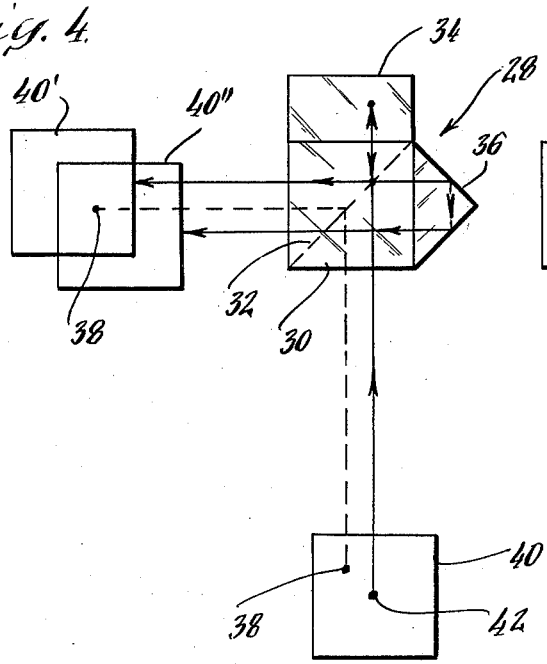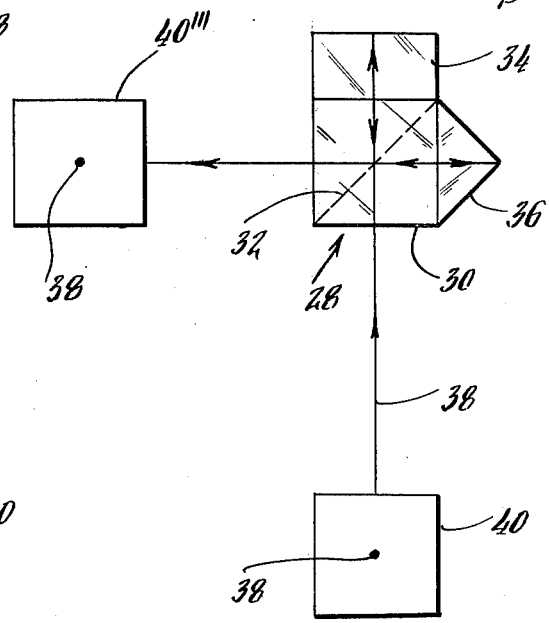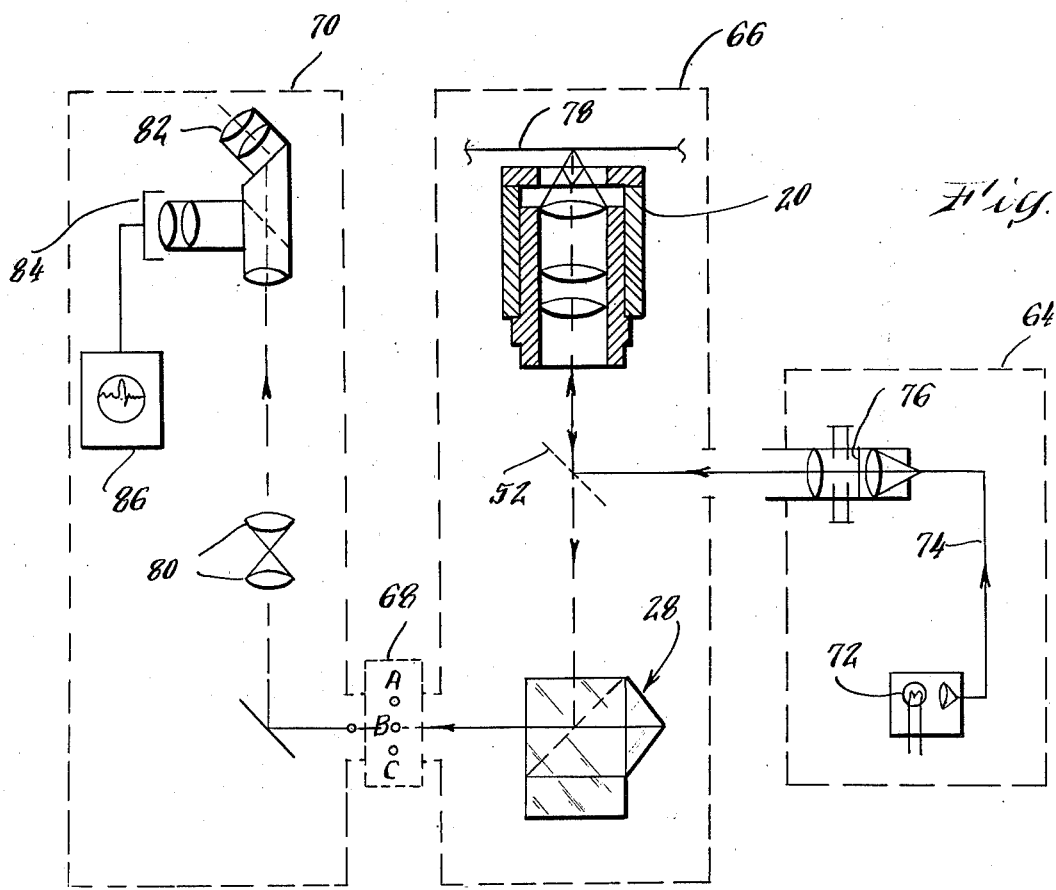

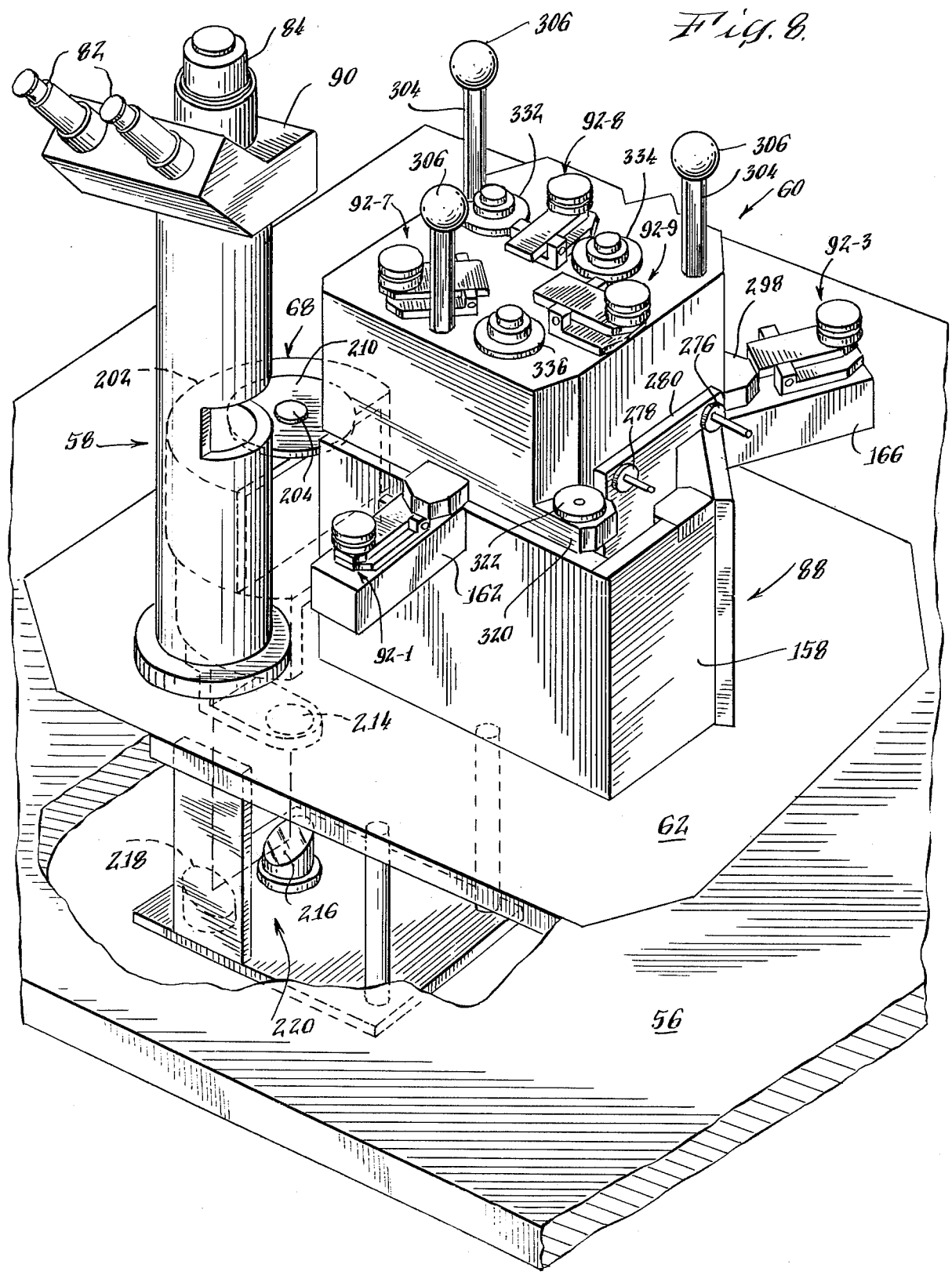

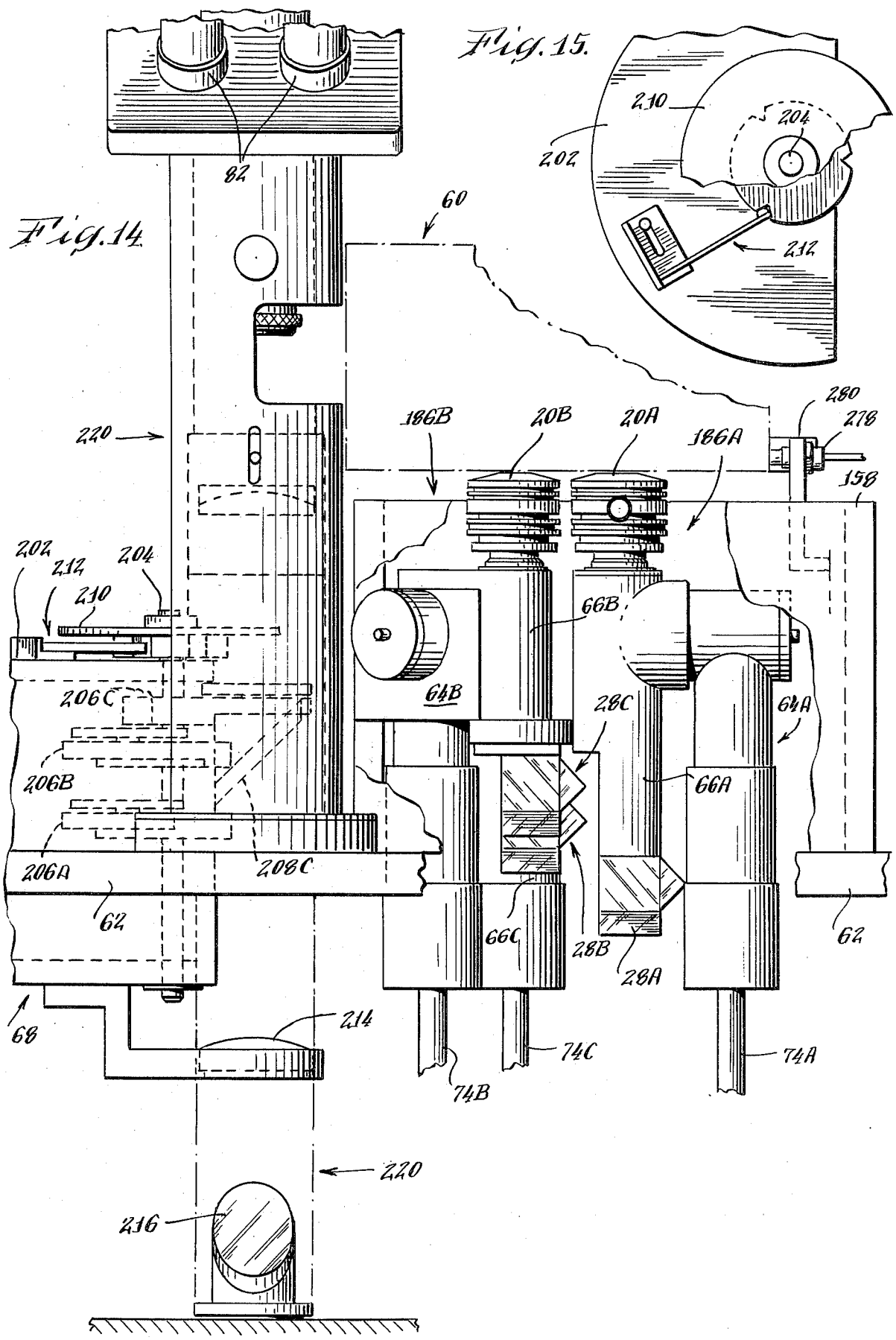

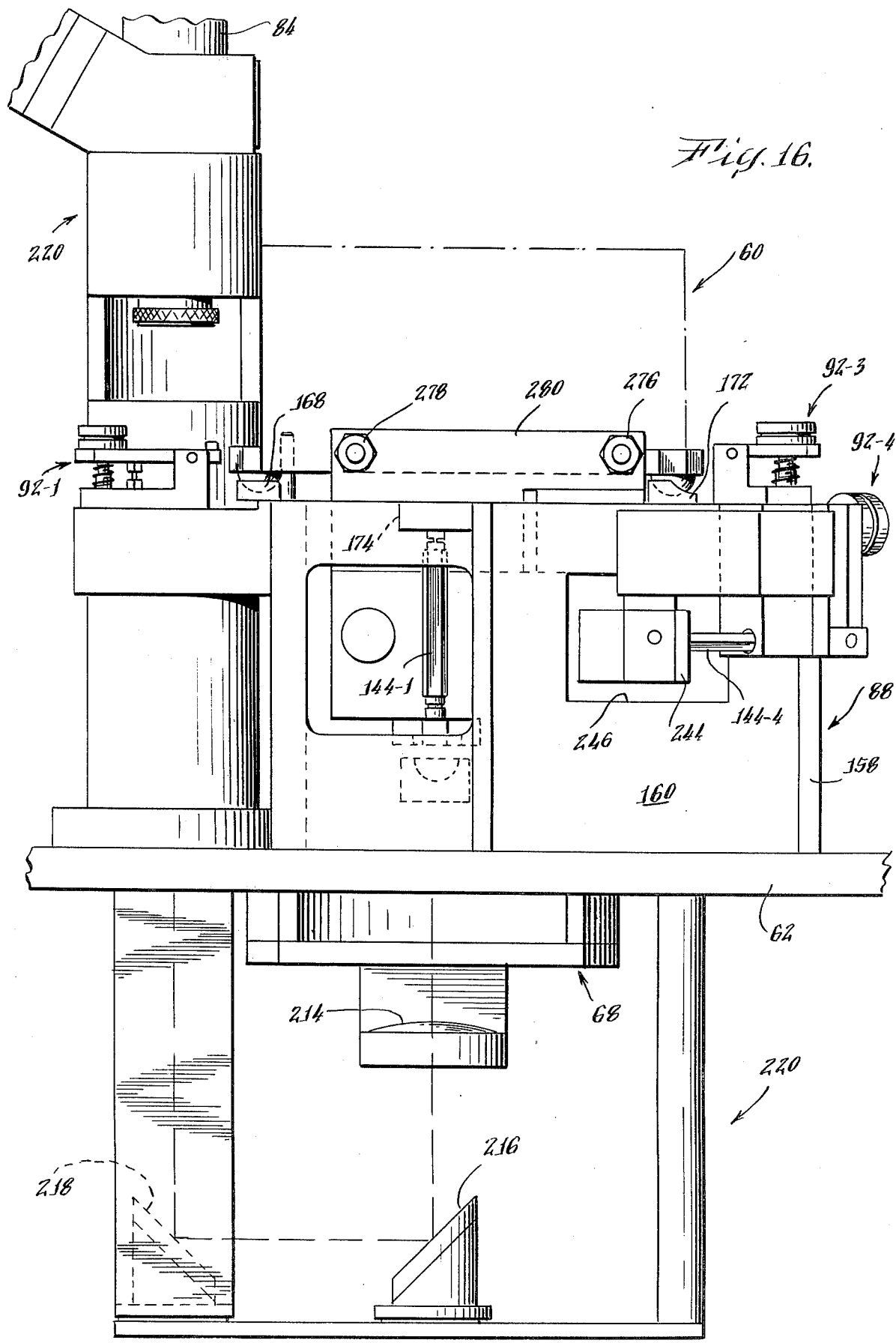

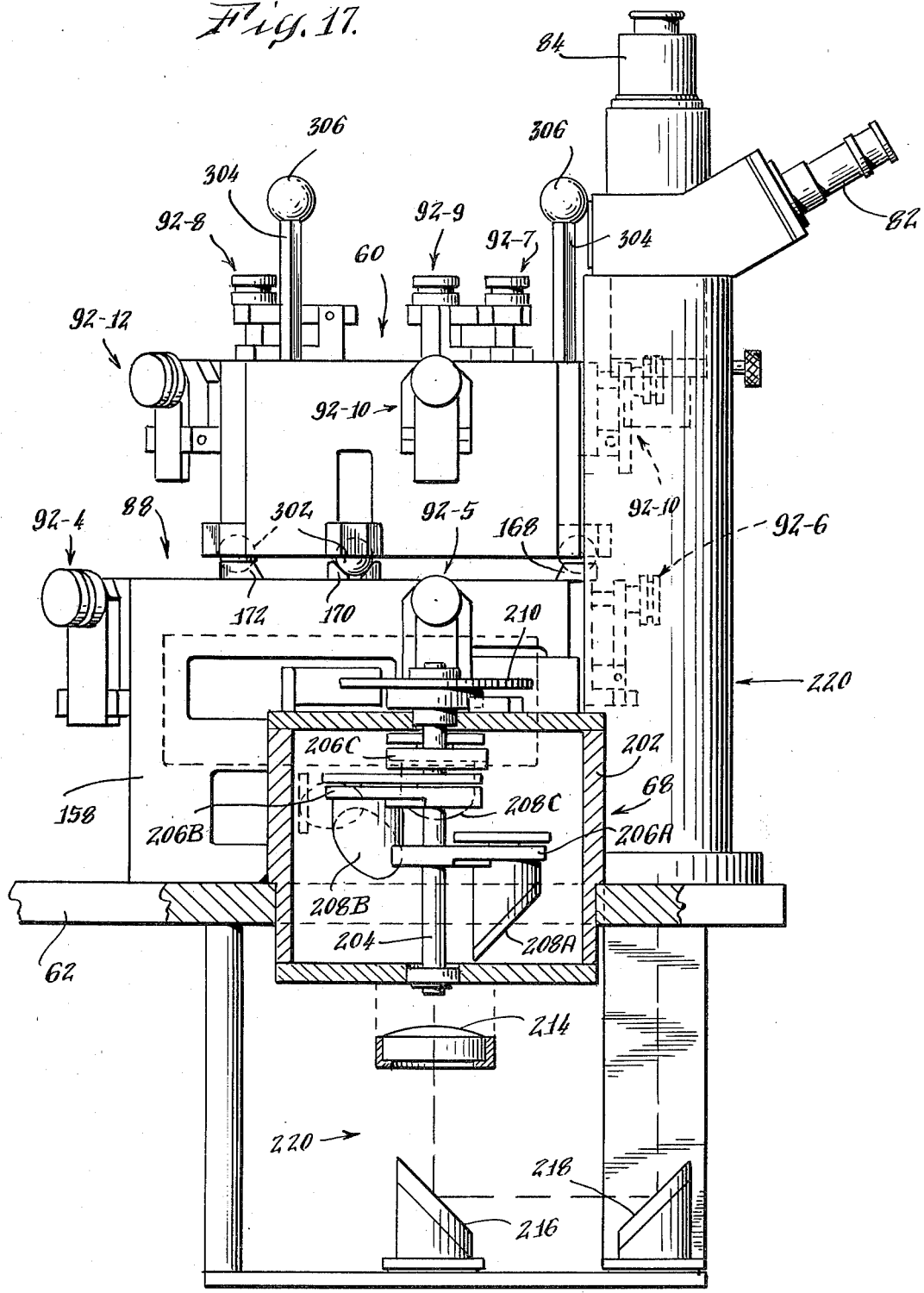

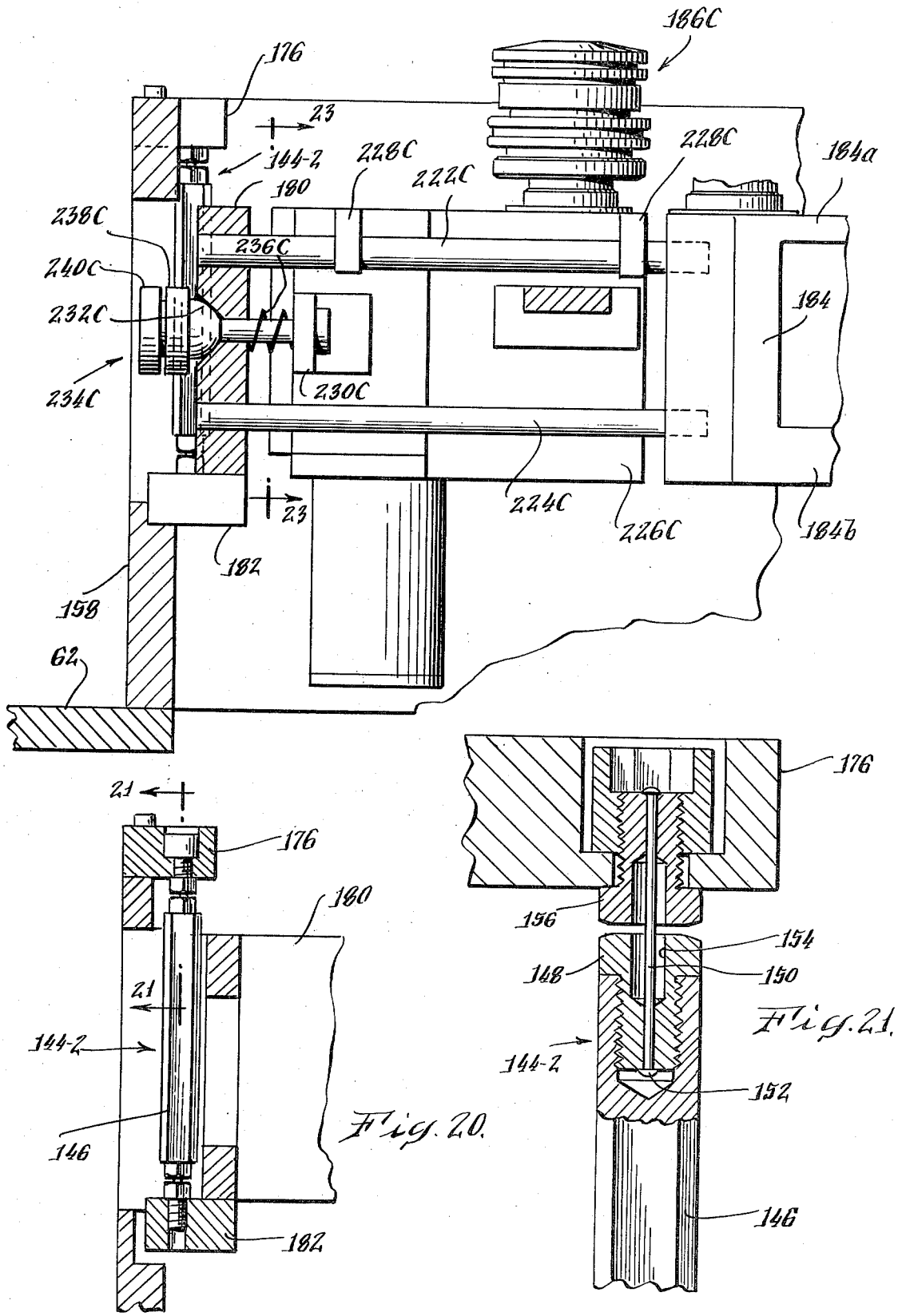

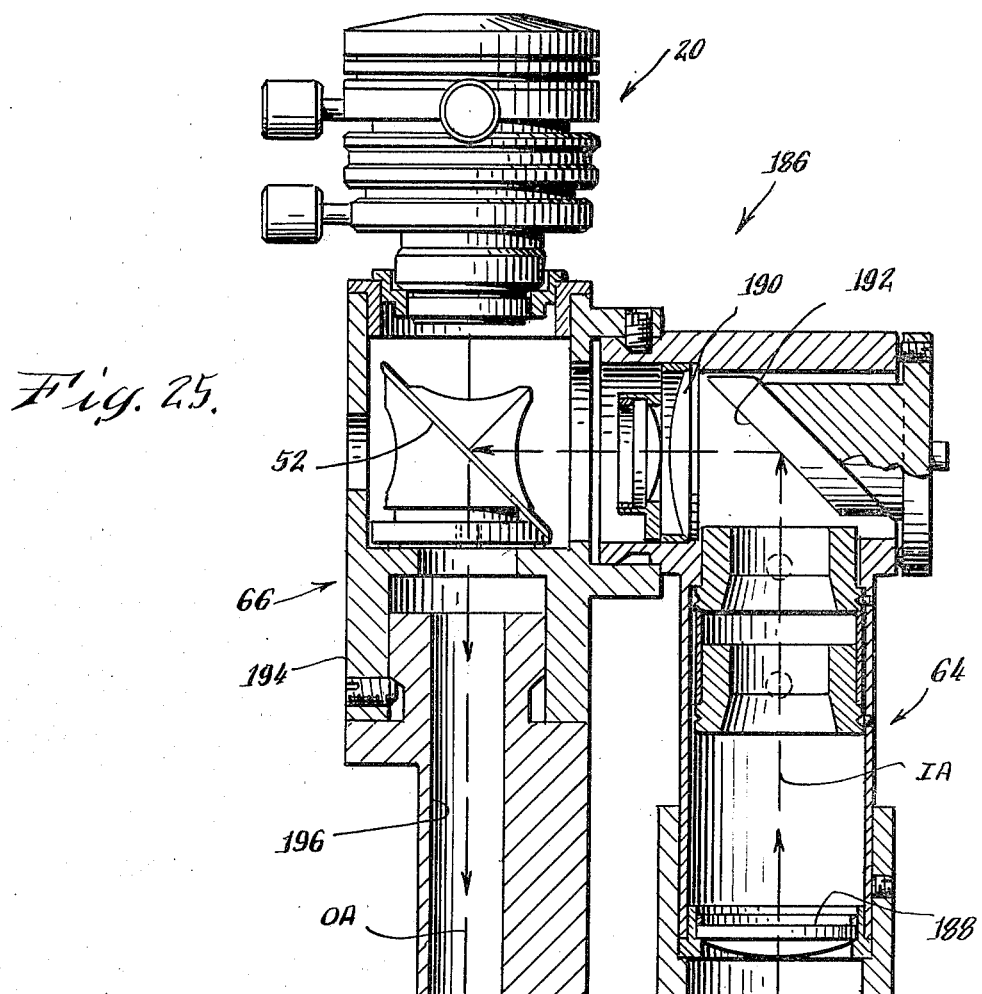
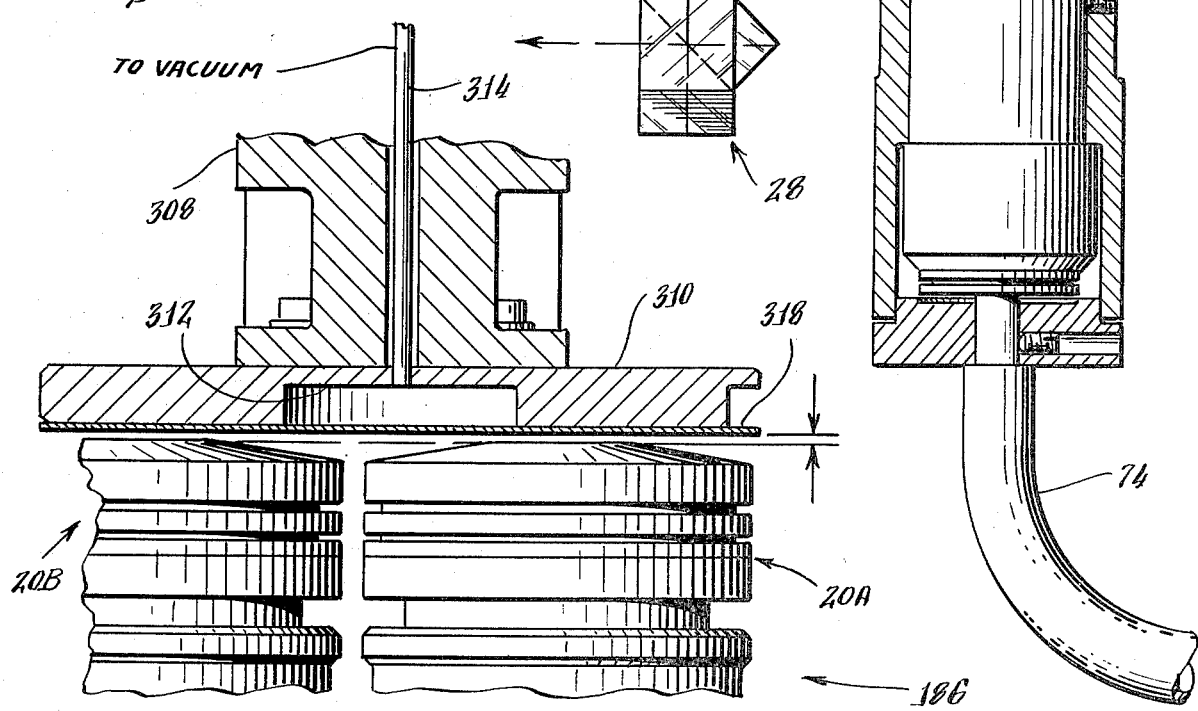
Fig. 25.
Fig. 26.

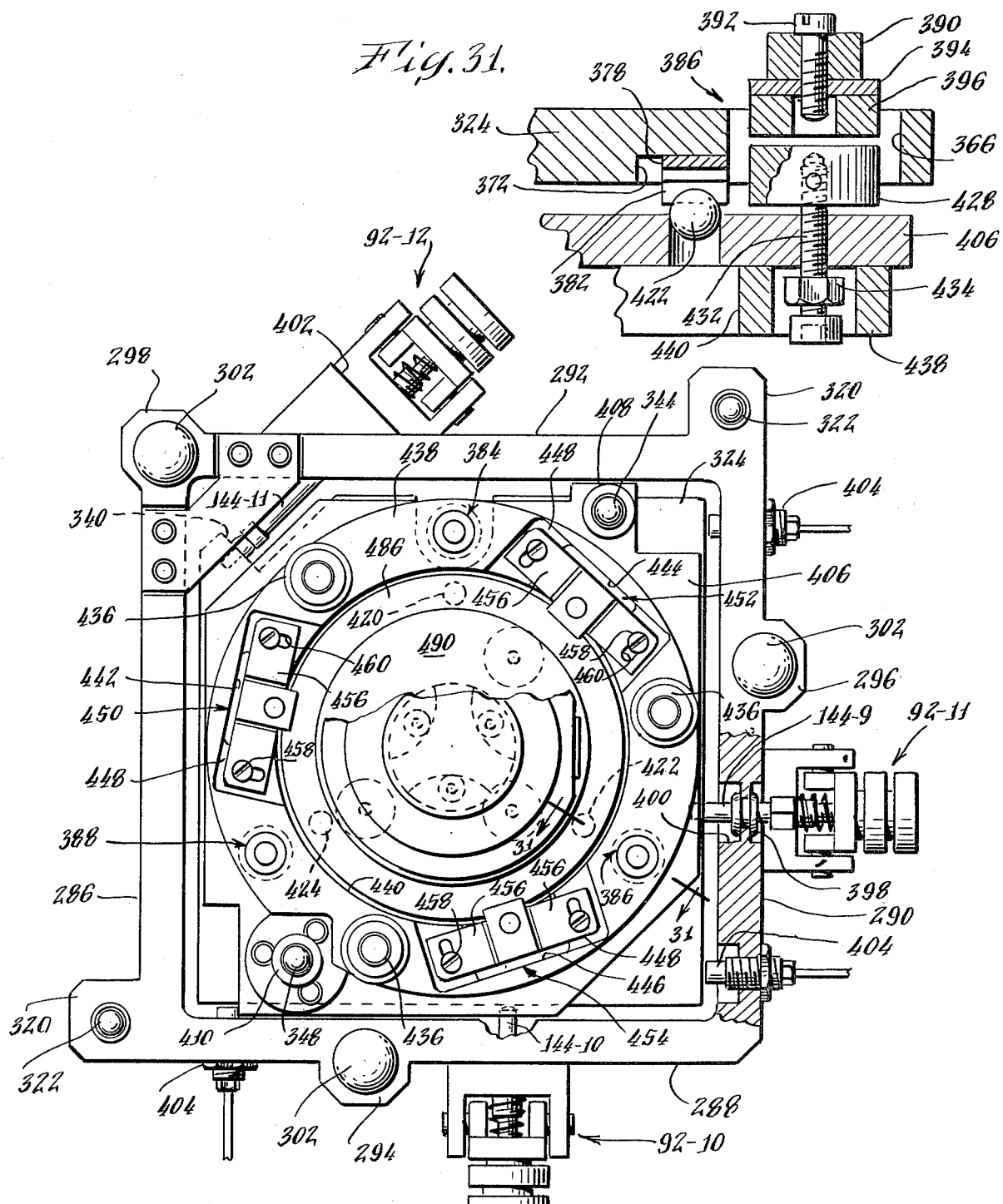

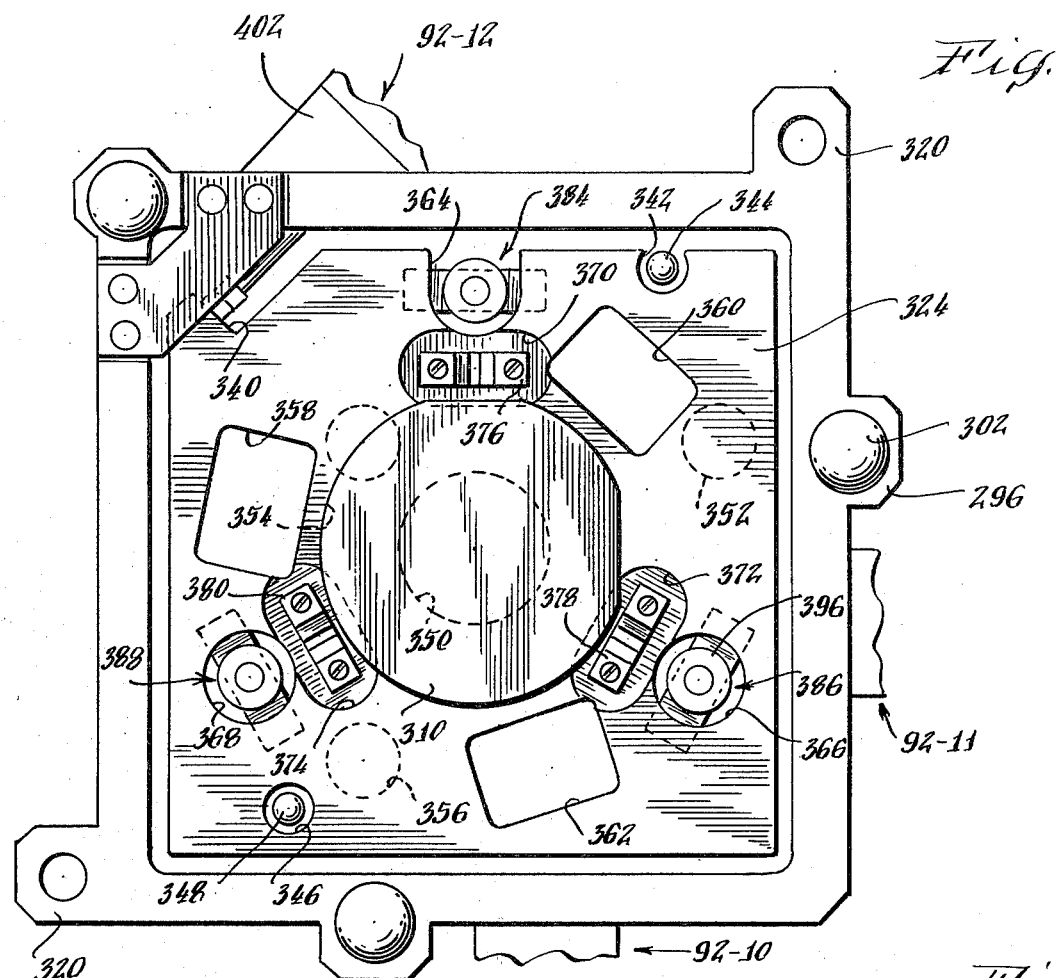　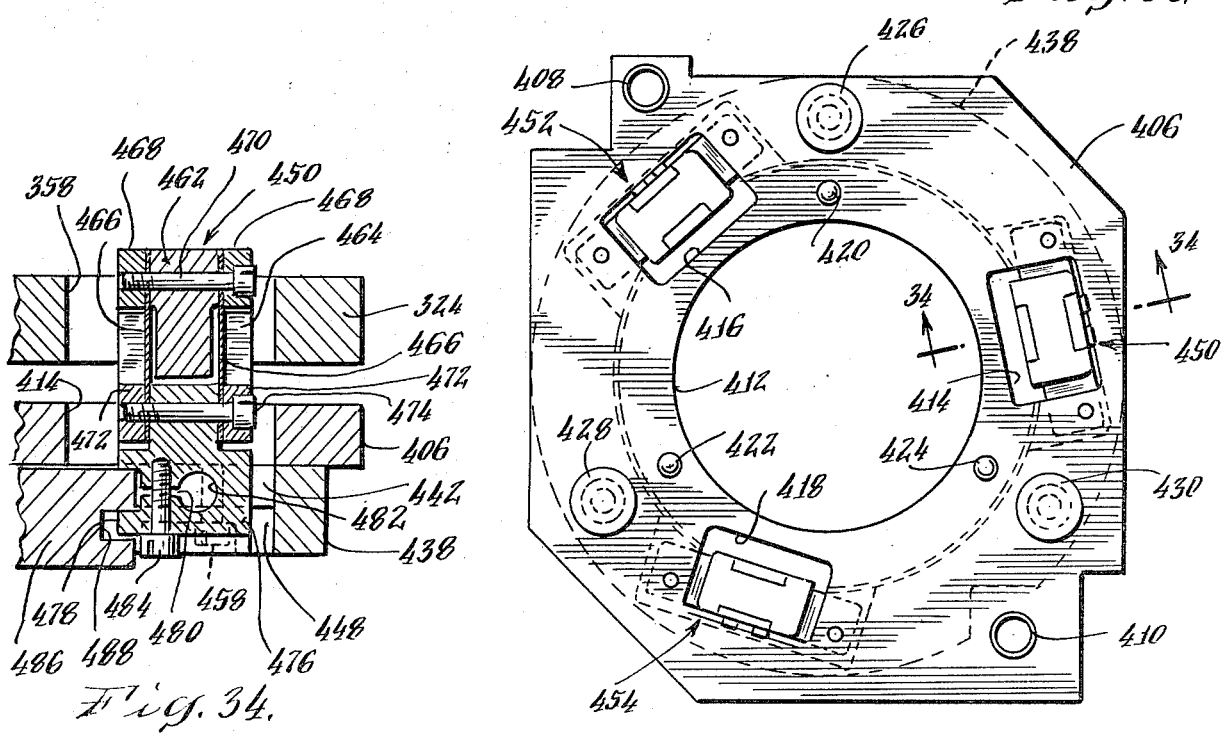

METHOD AND APPARATUS FOR ALIGNING AN OPAQUE MASK WITH AN INTEGRATED CIRCUIT WAFER

BACKGROUND OF THE INVENTION

The conventional method of manufacturing integrated circuits involves the photolithographic replication of patterns from a mask onto a silicon wafer surface which has been treated with a photoresist material. Each such step is followed by conventional procedures such as developing, plating, etching, etc. These steps may be repeated a number of times on a single wafer, each pattern overlying patterns previously applied. With increasing miniaturization, the pattern elements have become smaller and smaller to the extent that pattern resolution is limited by the wavelength of light. This has already led to use of the shorter wavelengths of the ultraviolet spectrum. The successor technology appears to be X-ray lithography.

One of the problems which will arise in the use of X-ray lithography is that the masks are likely to be opaque to visible radiation. This would essentially rule out the use of conventional optical proximity aligners for mask to wafer alignment. There are several reports in the literature of X-ray alignment schemes for opaque masks. (J. H. McCoy and P. A. Sullivan, "Precision Mask Alignment for X-ray Lithography", *Electron & Ion Beam Sci. and Tech.-7th Intnl. Conf. Proc.*, 536 (1976).) In one, X-rays are transmitted through marks in the mask and substrate and, in another, X-rays are transmitted through marks in the mask and excite fluorescent X-rays from substrate alignment marks. Many of these techniques require undesirable heavy metal alignment marks in the substrate or are limited to specific source-substrate combinations. Accordingly, it is a primary object of the present invention to provide method and apparatus for aligning an opaque mask pattern with a wafer pattern. Other objects, features, and advantages will become apparent from the following description and appended claims.

SUMMARY OF THE INVENTION

An opaque lithographic mask is aligned to a substrate wafer by providing a plurality of alignment targets on one surface of each of the mask and the wafer. A plurality of microscope optical channels are positioned to view portions of a reference plane. The wafer is positioned with its alignment targets in the reference plane. The optical axis of each of the optical channels is aligned with a different one of the targets on the wafer. The wafer is then displaced from the reference plane to an exposure plane parallel to the reference plane, while retaining its alignment relative to the optical axis. The mask is placed in the reference plane and is positioned to align each of its alignment targets with one of the optical axes without changing the alignment of the axes. The mask and wafer are then transported to an exposure station while retaining the alignment therebetween.

BRIEF DESCRIPTION OF THE DRAWINGS

FIG. 1 is a schematic illustration of two optical channels being aligned with targets on a wafer;

FIG. 2 is a diagram similar to FIG. 1 showing the wafer retracted and a mask inserted;

FIG. 3 is a perspective schematic illustrating the aligned mask and wafer at an exposure station;

FIG. 4 is a schematic illustration of the apparatus employed for lateral alignment with the target and optical axis misaligned;

FIG. 5 is a view similar to FIG. 4 with the target and optical axis aligned;

FIG. 6 is a schematic illustration of the method of alignment in the vertical direction;

FIG. 7 is a schematic illustration of the elements of a single optical channel;

FIG. 8 is an overall perspective view of the aligner of the invention;

FIG. 14 is a front view, partially broken away, of the aligner of FIG. 13;

FIG. 15 is a partial top view of the channel selector detent mechanism of the aligner;

FIG. 16 is a right side view of the aligner of FIG. 13;

FIG. 17 is a left side view, in partial cross-section, of the aligner of FIG. 13;

FIG. 19 is a cross-section taken substantially along the line 19—19 of FIG. 18;

FIG. 20 is a cross-section taken substantially along the line 20—20 of FIG. 18;

FIG. 21 is an enlarged cross-section taken substantially along the line 21—21 of FIG. 20;

FIG. 25 is a vertical section through one of the optical channels of the invention;

FIG. 26 is an enlarged cross-section of a wafer held in the wafer chuck of the invention;

FIG. 30 is a bottom view of the cartridge of FIG. 27;

FIG. 31 is an enlarged cross-section taken substantially along the line 31—31 of FIG. 30

FIG. 32 is a bottom view of the cartridge with the adapter plate removed;

FIG. 33 is a rear view of the adapter plate;

FIG. 34 is an enlarged cross-section taken substantially along the line 34—34 of FIG. 33.

DESCRIPTION OF THE PREFERRED EMBODIMENT

I. Alignment Method

A. General Approach

Figure 9:
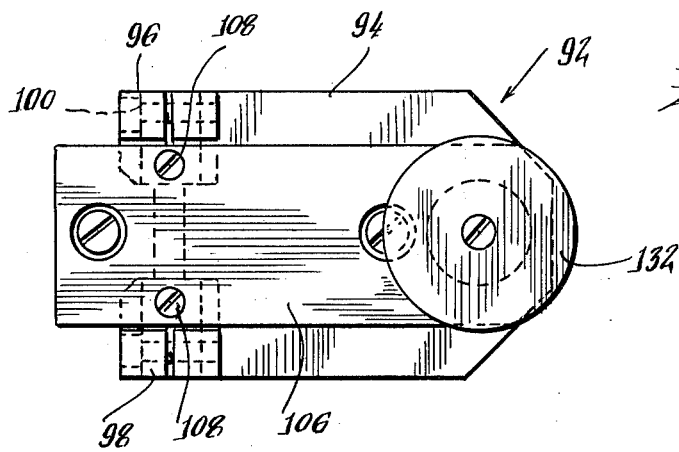
FIG. 9 is a top view of a lever reduction machine employed with the present invention.

Incorporated into the pattern on each mask or wafer are three targets positioned at the corners of a right triangle. When the targets are aligned, the respective patterns are also aligned. In order to align optically opaque masks, the optical axes of three alignment channels in an "optical head" are used as alignment transfer references. Both the mask and the wafer are mounted in a cartridge which can be separated from the optical head.

The cartridge is a highly stable fixture which permits the mask-wafer assembly to be transported to an exposure station while maintaining precise alignment. The cartridge includes a vacuum chuck which supports the wafer above the objectives of the three optical channels.

FIG. 1 schematically illustrates a wafer 10 supported by a chuck 12. As viewed in FIG. 1, only two of the wafer's targets 14, 16 (greatly enlarged) are seen. The third target 18 is hidden, but may be seen in FIG. 35. The three optical channels of the apparatus of the invention are designated A, B and C. In the following discussion, similar elements of the optical channels are given similar reference numerals but with the appropriate letter attached. Thus there are illustrated in FIG. 1 the objectives 20A, 20B.

The elements of optical channels A, B and C are movable relative to the wafer 10 in FIG. 1. They may be adjusted along the x and y axes, lying in the plane of the wafer, and along a z axis which is perpendicular to the wafer plane. A reference plane is first established by adjustably positioning the wafer until each target is positioned a predetermined distance from its corresponding objective. Next, the optical channels A, B and C are themselves adjusted laterally along the x and y axes until their optical axes are aligned with the respective targets. At this point, the optical channels are aligned and their settings are not thereafter disturbed.

The wafer is now vertically displaced by a known amount from the established reference plane and the opaque mask is interposed at the original reference plane. This is done by removing the cartridge, inserting a mask carrier 22 and mask 24 (FIG. 2), and replacing the cartridge. With both the optical channels and the wafer remaining fixed, the mask is now laterally aligned along the x and y axes until its targets are positioned on the optical axes of the A, B, and C channels. Thereafter, the cartridge, with the wafer 10 and mask 24 locked securely therein, is taken to an exposure station where the mask and wafer are exposed to an X-ray source 26 as illustrated in FIG. 3.

It will be obvious, of course, that the schematic illustrations of FIGS. 1-7 are greatly distorted. For example, typical diameters for mask and wafer might be on the order of 3" while the final displacement of the surface of the wafer 10 from mask 24 would be on the order of 50 micrometers ($\mu$m).

B. Lateral Alignment

Lateral alignment is accomplished by means of a microscope and prism assembly. The purpose of the prism is to define the axis of the microscope. The operating principles are illustrated in FIGS. 4 and 5, which schematically illustrate one of the three identical optical channels. One implementation of the prism assembly 28 comprises a cubic body 30 containing internally an angled beam splitter 32 and externally two 90° roof prisms 34, 36. The optical axis of the illustrated channel is shown as 38. For purposes of illustration, a square alignment target 40 is illustrated.

The effect of the prism is to generate two images which are rotated 180° relative to each other. As a result, if the alignment target center 42 is not coincident with the axis 38 of the optical system, double images 40', 40" are seen as shown in FIG. 4. However, if the alignment target center 42 is brought into coincidence with the optic axis 38, the two images coincide and a single image 40''' is seen as shown in FIG. 5. Although the operating principle differs, the system functions (in one axis) similar to the well known image range finder on a camera.

C. Vertical Alignment

Vertical alignment is accomplished by means of a white light interferometer for defining the position of an alignment mark in the z direction, i.e., parallel to the optical axis. In this arrangement, a beam splitter and reference mirror are combined in an assembly that mounts directly on the microscope objective. This permits the same optical channel to be used for both lateral and vertical alignment. One way in which this is implemented is illustrated in FIG. 6. FIG. 6 illustrates the microscope objective 20 surrounded by a rigid mount 44 which carries a beam splitter 46 spaced a distance z from the wafer or mask surface 48. A reference mirror 50 is positioned adjacent the surface of the objective. An angled beam splitter 52 is positioned on the other side of the objective. The assembly is illuminated by a light beam 54 which illuminates the interferometer as shown by the arrows and then passes to the eye and to a photodetector. The wafer or mask reference plane is established when $z=z_0$. The $z_0$ alignment corresponds to minimum light returned (a gray null fringe or other prespecified color depending upon the wafer or mask surface layers and optical element coatings).

II. General Description of Apparatus

The apparatus of this invention is illustrated in FIG. 8 as mounted in a bench top 56 or other suitable support structure. Its basic components are an optical system 58 and a removable cartridge 60. The optical system is supported by a base plate 62.

A. Optical System

The optical system of the invention comprises three optical channels, any one of which may be selected for viewing by a single microscope (binocular) eyepiece assembly. A single channel is illustrated schematically in FIG. 7. It comprises an illuminator 64, an alignment channel 66, an optical channel selector 68, and an output 70. The illuminator 64 comprises a lamp 72 which supplies light via a fiberoptical cable 74 through a filter 76 to a beam splitter 52 in the alignment channel 66. The beam splitter 52 illuminates the reference plane 78, which will normally contain the mask or wafer surface, and returns through the beam splitter 52 to prism assembly 28 where it is redirected to the optical channel selector 68. The three alignment channels 66 (A, B, C) are identical and the selector 68 is shown schematically as passing radiation from channel B. Radiation from the selected channel is directed through relay telescope 80 to a microscope eyepiece 82 and a photoelectric detector 84 for display on an oscilloscope 86.

As will be seen in FIG. 8, the optical system 58 includes an optical head 88 and a microscope 90 with the optical channel selector 68 therebetween. The optical head houses the three illuminators 64 and the elements of the three alignment channels 66.

B. Cartridge

Mounted on top of the optical head 88 is the removable cartridge 60. It is the function of cartridge 60 to hold a wafer in position while the various optical channels are aligned to it, and to hold a mask while it is being positioned into alignment with the optical channels.

The entire cartridge 60 holding the mask and wafer can then be removed to the X-ray exposure station.

III. Detailed Description of Apparatus

A. Lever Reduction Machine

Figure 10:
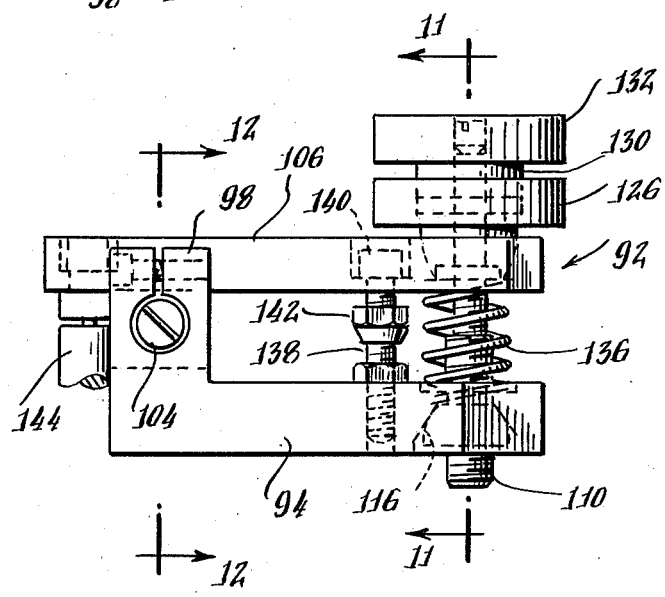
FIG. 10 is a side view of the machine of FIG. 9.

A basic element of the mechanical alignment system of the invention is the lever reduction machine 92 illustrated in FIGS. 9–12. It comprises a base 94 having at one end a pair of spaced support pillars 96, 98. Each of support pillars 96, 98 is drilled and bifurcated so as to clampingly engage, by means of screws 100, a pair of rotary flexures 102, 104. One suitable flexure for this application is the "Bendix Flexure Pivot", Catalogue No. 5010-600 of The Bendix Corporation, Baltimore, Md. These flexures support a lever arm 106 by means of set screws 108. The lever arm 106 has a long end which parallels base 94 and a short end which extends in the opposite direction from the flexures 102, 104 as illustrated in FIG. 10.

Figure 11:
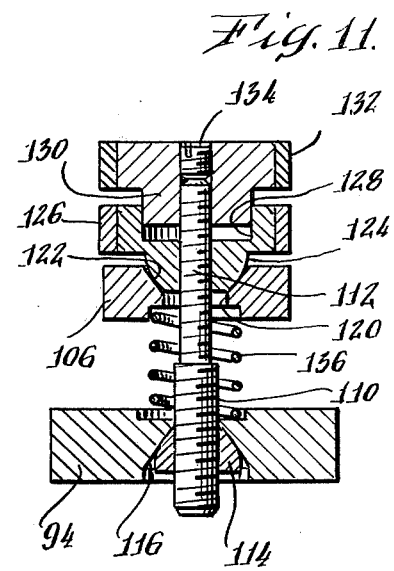
FIG. 11 is a cross-section taken substantially along the line 11—11 of FIG. 10.
Figure 12:
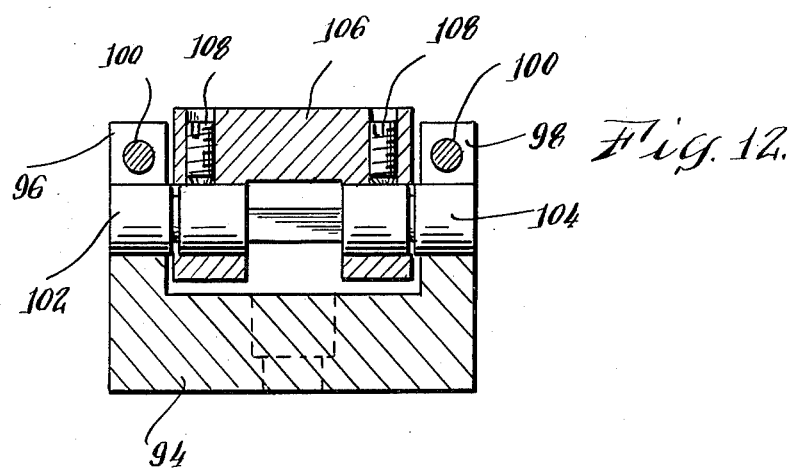
FIG. 12 is a cross-section taken substantially along the line 12—12 of FIG. 10.

The long end of lever arm 106 is operable by means of a differential screw mechanism which is most clearly shown in FIG. 11. It comprises a differential screw having a lower portion 110 which, in one particular embodiment, has 28 threads per inch and an upper portion 112 which, in the same embodiment has 32 threads per inch. Lower portion 110 is threaded through a hemispherical block 114 which is positioned in a conical recess 116 of base 94.

Upper screw portion 112 extends through a hole 120 in lever arm 106 which includes a conical countersink 122 at the upper surface of the lever arm 106. The upper screw portion 112 is threaded through a spherical boss 124 which depends from a "coarse" adjustment knob 126. The coarse knob 126 defines an upper recess 128 which encloses a cylindrical projection 130 from a "fine" adjustment knob 132. The fine adjustment knob 132 is fixedly secured to the upper end of the differential screw by means of a jam screw 134.

The differential screw is loaded against the long end of the lever arm 106 by means of a coil spring 136 between the lever arm and base 94. Travel of the lever arm 106 is limited by a screw 138 upon which are positioned limit stops 140, 142 as shown in FIG. 10. The short end of the lever arm 106 is connected to a push rod 144 or to any other element whose position is to be adjusted.

When the coarse adjustment knob 126 is rotated, it will be advanced or retracted along the upper differential screw portion 112 without significant rotation of the differential screw. When the fine knob 132 is rotated, it will rotate the differential screw which will advance or retract at one rate relative to block 114 and at another rate relative to the boss 124. In one embodiment of this invention, the lever arm and the differential threads are so selected that one complete turn of the fine adjustment knob results in a 25 micrometer displacement of the short end of the lever, the total range being approximately 600 micrometers.

B. Double Universal Rod

As pointed out in the preceding section, the lever reduction machine may be employed to operate a push rod. There is illustrated in FIGS. 20 and 21 a double universal rod construction which may be employed in this invention as such a push rod, and also for other applications as will be explained below. It comprises a central aluminum rod 146 which is tapped at each end to receive a hexagonal headed screw 148. The screw is drilled axially to receive a stainless steel tempered wire 150 which is welded to the screw end as at 152. Surrounding the wire 150 at the head end of the screw 148 is an enlarged recess 154. The opposite end of the wire 150 is also welded to a similar, but reversed, headed screw 156. Each end of the rod 144 is similarly constructed. In a typical construction, the wire 150 has a diameter of 0.035" and the heads of adjacent screws 148, 156 are separated by 0.010". A universal rod 144 constructed in this fashion is axially stiff but is otherwise flexible. As a result of such design, it transmits axial motion with minimal crosscoupling in other directions.

C. Optical System

The optical system of the apparatus of this invention, as previously explained, comprises an optical head, a microscope, and a channel selector. These elements are illustrated in FIGS. 13–25. The optical head is that portion which includes the optics for directly viewing the three targets on the mask or wafer. The microscope is the subassembly which provides for direct viewing by the user of one of the optical channels included in the head. The channel selector is the mechanism for optically selecting which of the channels is being viewed by the microscope. The optical head 88, channel selector 68, and microscope 90 are shown in plan view in FIG. 13.

Figure 13:
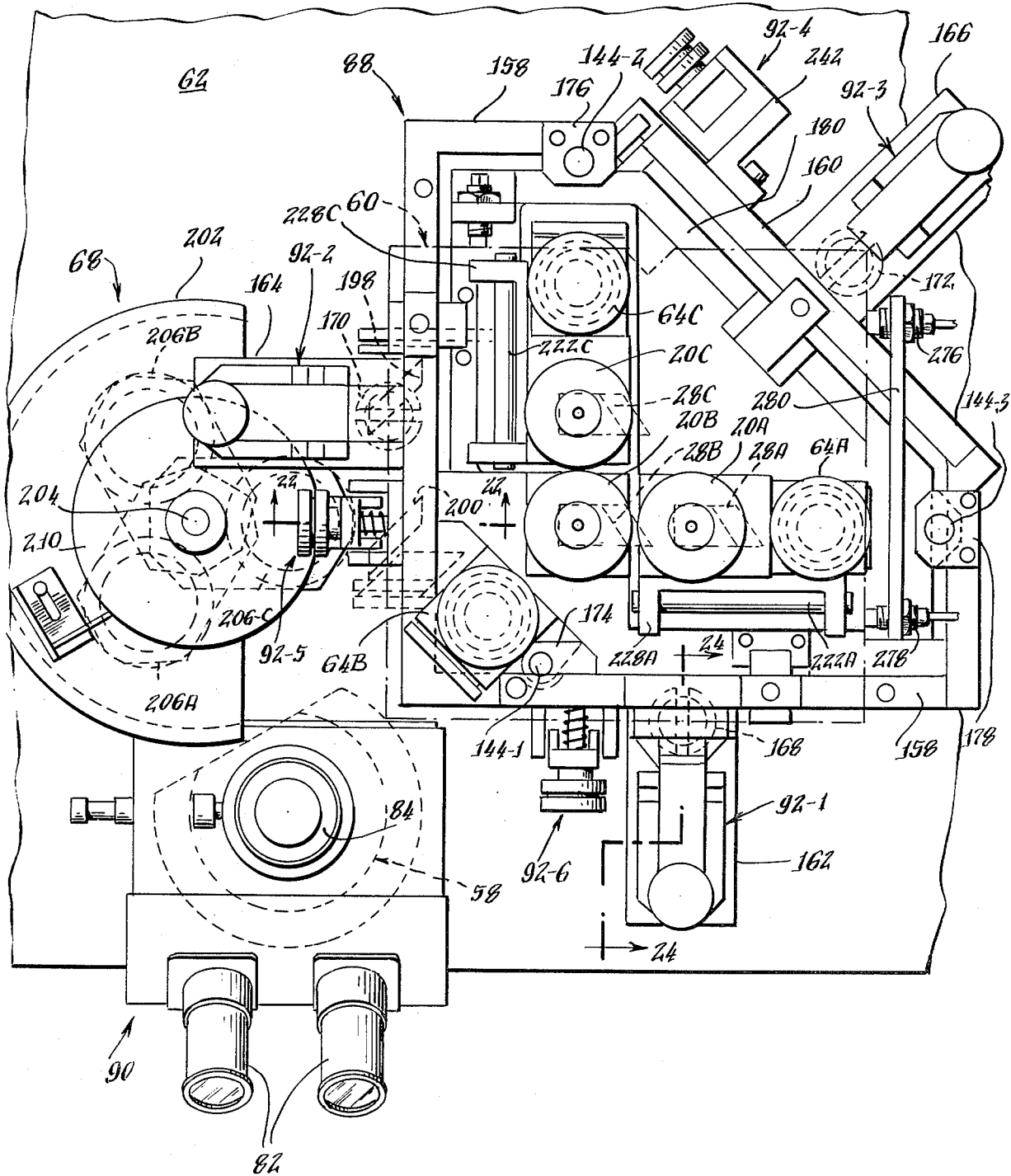
FIG. 13 is a top view of the optical head portion of the aligner of the invention with the cartridge removed.
Figure 18:
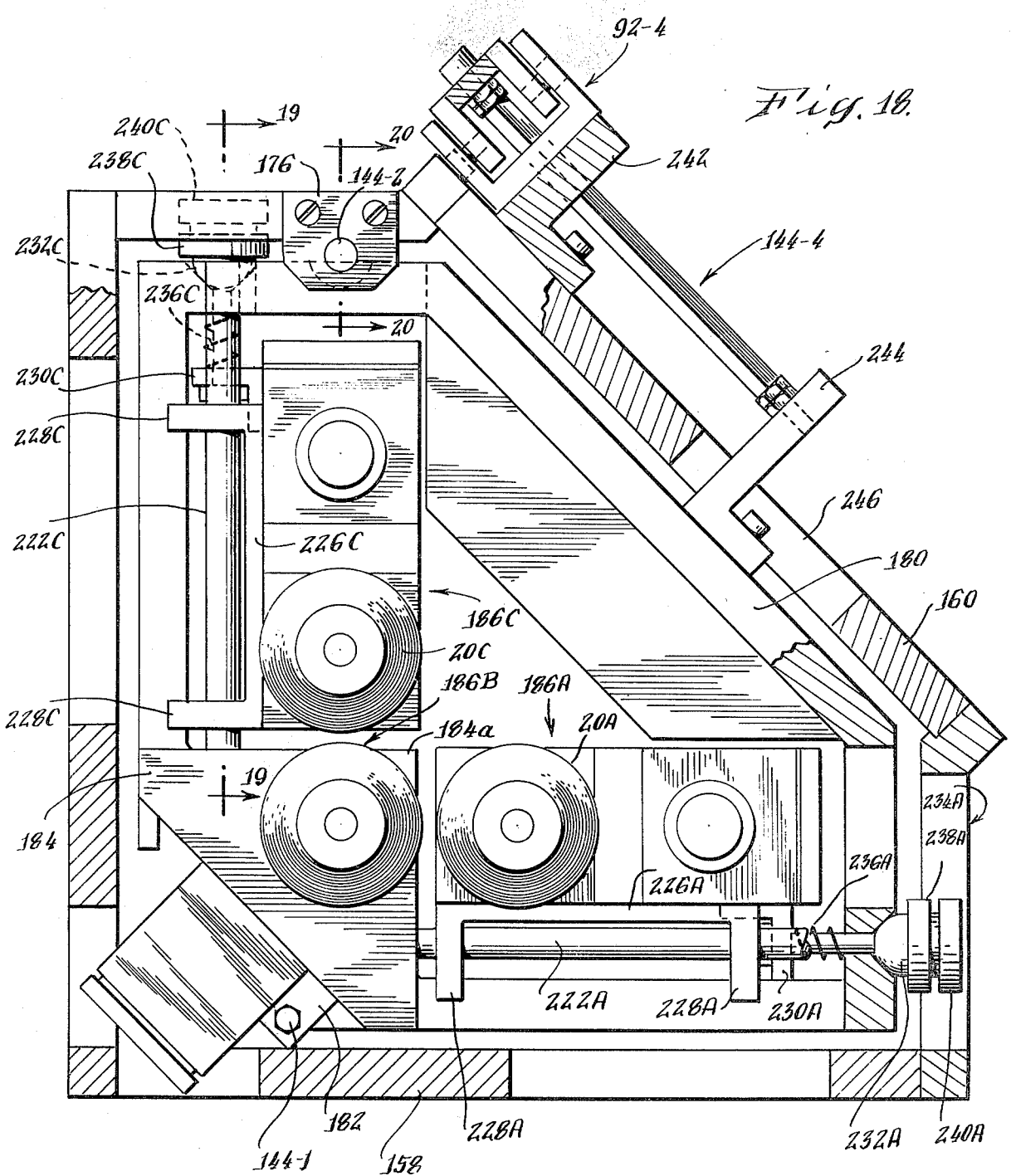
FIG. 18 is a top view of the optical head, illustrating a portion of the adjustment mechanism.
Figure 22:
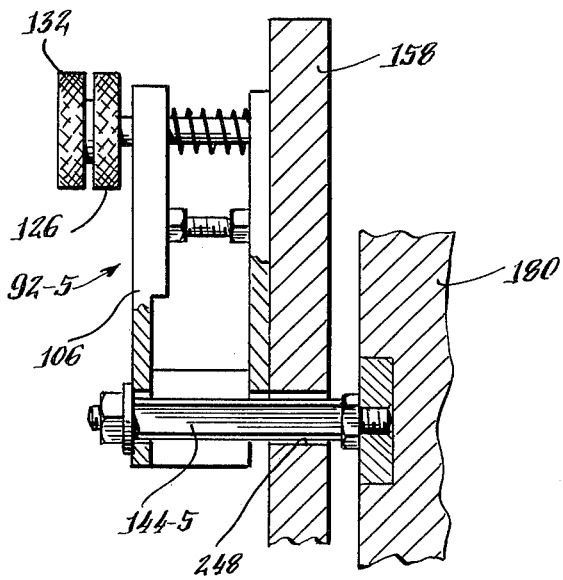
FIG. 22 is an enlarged cross-section taken along the line 22—22 of FIG. 13.
Figure 23:
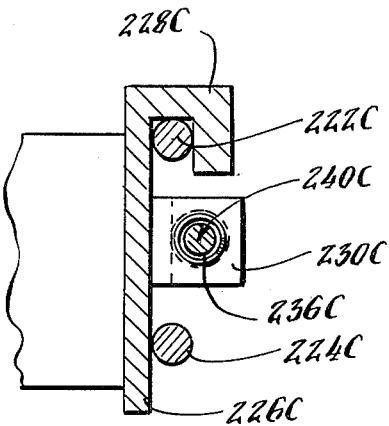
FIG. 23 is a cross-section taken along the line 23—23 of FIG. 19.
Figure 24:
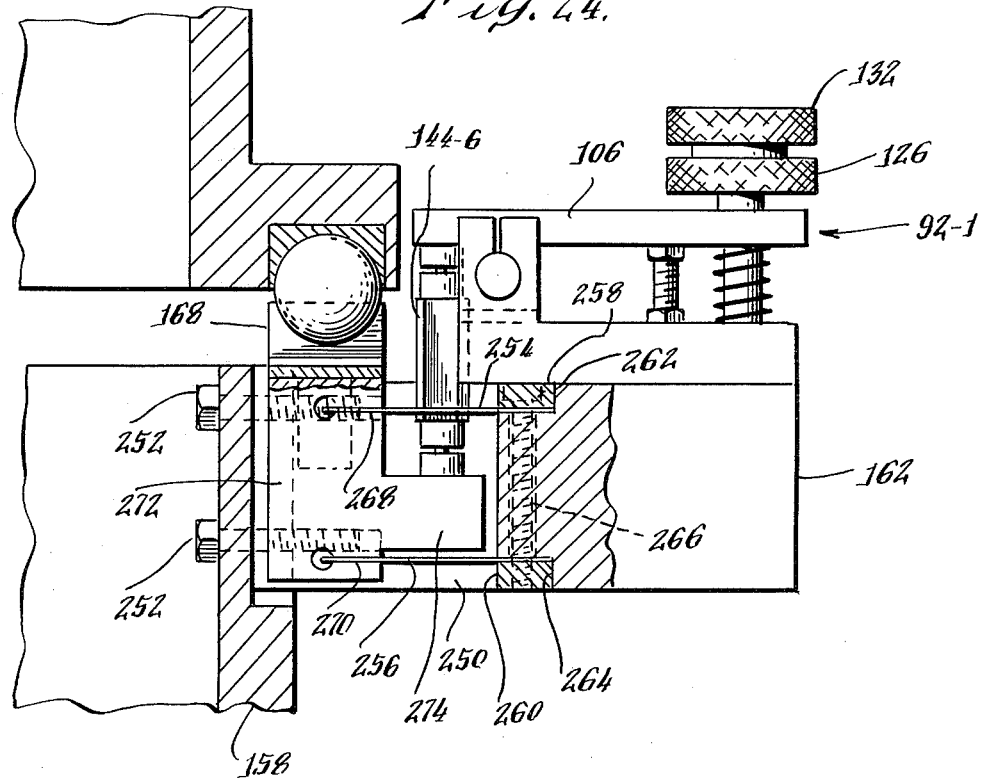
FIG. 24 is an enlarged cross-section taken along the line 24—24 of FIG. 13.
Figure 27:
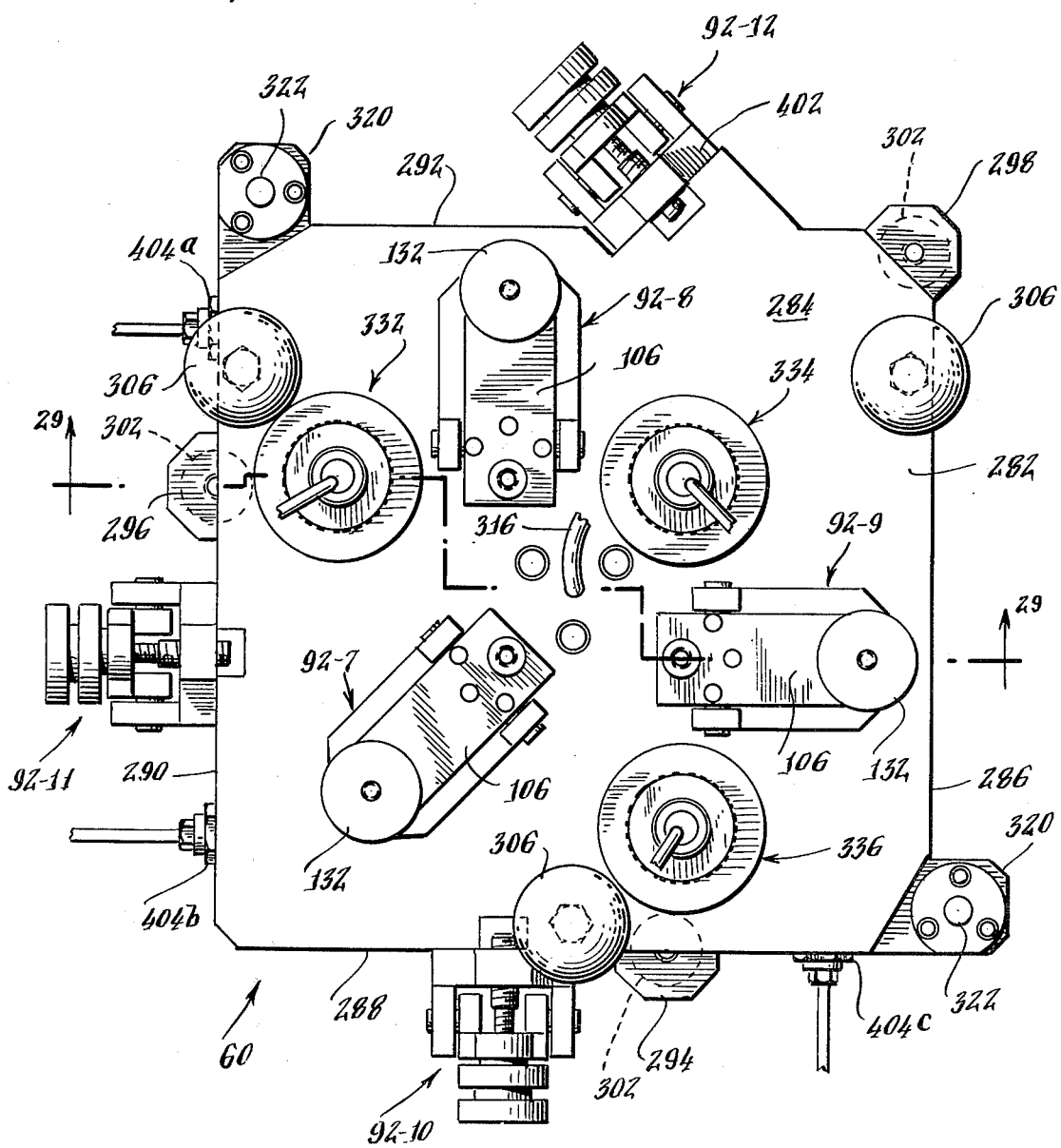
FIG. 27 is a top view of the cartridge portion of the invention.
Figure 28:
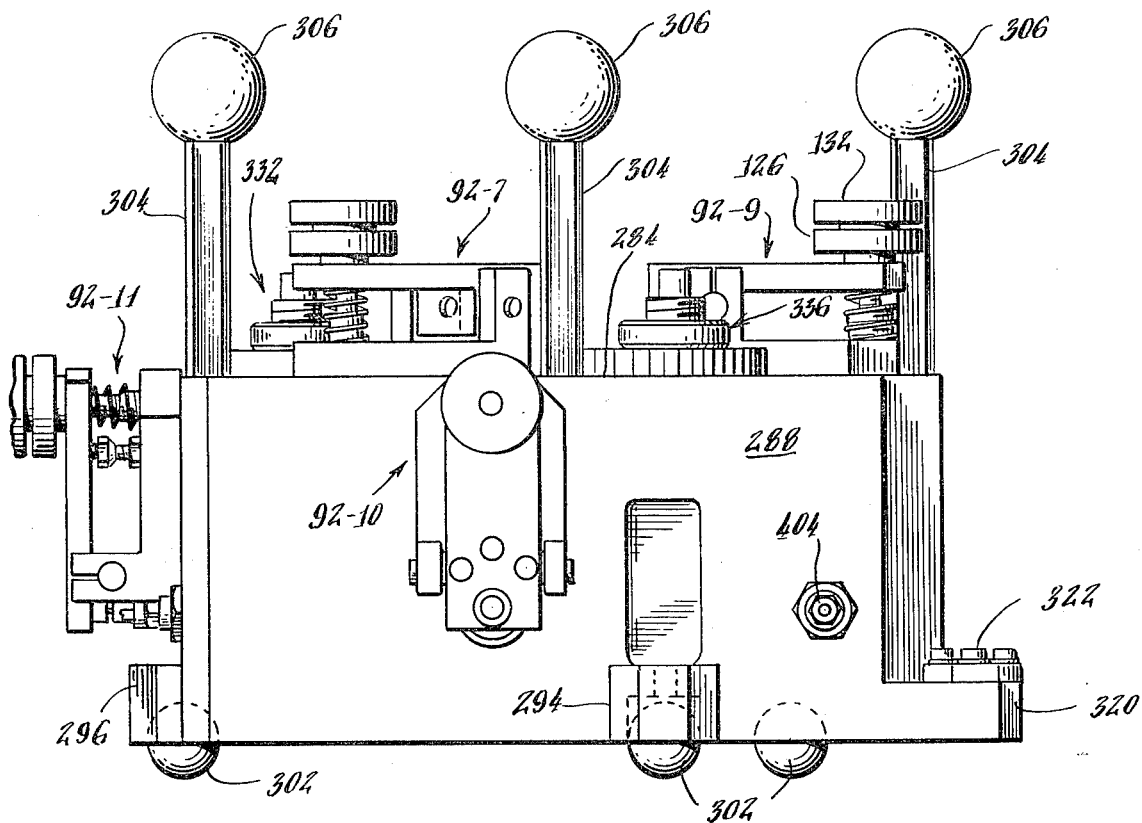
FIG. 28 is a front view of the cartridge of FIG. 25.

The optical head 88 comprises a boxlike, open topped, reference frame 158 which extends upwardly from the base plate 62. That portion of the base plate 62 within the boundaries of the reference frame is cut away to permit the various elements to extend below the level of the bench top 56. The reference frame 158 is basically formed with vertical sidewalls, essentially in the form of a square but having one corner replaced by an angled wall 160 as shown in FIG. 13.

Extending outwardly from each of the major sidewalls of reference frame 158 and at its top edge is a horizontal pedestal. These are illustrated as front pedestal 162, left pedestal 164, and an angled pedestal 166 which extends outwardly from the angled wall 160. Mounted upon each of these respective pedestals is a lever reduction machine 92 of the type previously described. Throughout this description, all such lever reduction machines will be given the reference numeral 92 but followed by a distinguishing numeral. Hence, the lever reduction machines on pedestals 162, 164, 166 are given the respective designations 92-1, 92-2, and 92-3. The short end of each lever arm of these lever reduction machines controls the vertical displacement of a circular block 168, 170, 172 having a V-shaped recess in its upper surface. These blocks are designed to support the cartridge as will be later explained.

Extending inwardly of the reference frame 158 from the front wall thereof is a support bracket 174. A similar bracket 176 extends inwardly from the rear wall and a third bracket 178 from the right wall. Hanging from each of these brackets is a double universal rod 144 of the type previously described in connection with FIGS. 20 and 21. As these rods are used in several places in the apparatus of the invention, they are also assigned a common number 144, but with a numeral appended. Thus, rod 144-1 hangs from bracket 174, rod 144-2 hangs from bracket 176, and rod 144-3 from bracket 178.

Suspended by the rods 144 within the reference frame 158 is an alignment frame 180. The alignment frame 180 is essentially triangular in shape to conform to the inner dimensions of the reference frame 158, as will be most apparent from FIG. 18. It includes projecting bosses 182 around its lower edge which are secured to the universal rods 144 as will be seen in FIG. 20. One corner of alignment frame 180 is formed by a member 184 which includes a pair of vertically spaced, horizontal triangular shelves 184a, b (FIG. 19).

Supported by the corner member 184 is a microscope objective and illuminator assembly 186B. This invention employs three such assemblies to define optical axes A, B, and C. A representative assembly is illustrated in FIG. 25. This assembly includes elements previously described in connection with FIG. 7 including, for example, an illuminator 64 which receives light through a fiberoptical cable 74. This light is directed via lens units 188, 190, and mirror 192 to the beam splitter 52 contained in an alignment channel 66 comprising a substantially vertical housing 194 atop which is mounted the conventional microscope objective 20. The housing 194 defines a light passage 196 surrounding the optical axis OA. At the bottom of the housing 194 at the end of the light passage 196, is mounted the prism assembly 28.

It will now be seen that light from a remote source is brought into the illuminator 64 through the fiberoptical cable 74 and passes along illuminating axis IA to the beam splitter 52. A portion of the light is redirected upwardly by the beam splitter, through the microscope objective 20, and onto the surface of the wafer or mask. It is reflected from the surface and a portion passes through the beam splitter 52 along the optical axis OA.

It was stated above that the three microscope objective and illumination assemblies are identical. This statement is subject to one modification. This is that the length of the housing 194 is different for each channel. Thus, as will be seen in FIG. 14, the prism assemblies 28A, 28B, and 28C are at different heights.

As viewed in FIGS. 13 and 14, the optical axes extend to the left from each of prisms 28A, B, C in parallel with one another. The optical axes from prism assemblies 28A and 28B are in the same vertical plane. By means of angled transfer mirrors 198, 200, the optical axis from prism assembly 28C is shifted into the same plane.

The optical channel selector 68 (FIG. 17) comprises a semicylindrical housing 202 which encloses a rotatable, vertical shaft 204. Extending radially outwardly from the shaft 204 and displaced angularly by 120° increments are selector mirror support arms 206A, 206B, 206C. Dependently mounted from each of these arms is an angled selector mirror 208A, 208B, 208C, each being positioned at the level of a corresponding prism assembly 28A, 28B, 28C. A disc 210 on the upper end of shaft 204 is manually rotatable to position a selected one of mirrors 208 into alignment with its associated prism where it is held by a detent mechanism 212 (FIG. 15). As an example, in FIG. 14 the mirror 208C is shown aligned with prism assembly 28C. Radiation from the selected prism is then directed downwardly through a lens 214 and is redirected by mirrors 216, 218 (FIG. 17) upwardly through a vertical light tunnel assembly 220 to the microscope having eyepieces 82 and a photoelectric detector 84 as previously explained.

Microscope objective assembly 186B is fixed relative to the alignment frame 180. However, objective assemblies 186A and 186C are both adjustable along mutually perpendicular axes to vary the spacing between objectives 20A and 20B and between objectives 20C and 20B. As will be seen most clearly from FIGS. 18 and 19, an upper guide rod 222C and a lower guide rod 224C are mounted horizontally in parallel alignment with their left ends, as viewed in FIG. 19, being positioned in a wall of the alignment frame 180 and their right ends being secured in the corner member 184 of the alignment frame. The microscope objective and illuminator assembly 186C is mounted against a vertical plate 226C from which laterally project a pair of spaced bracket hooks 228C. As will be seen most clearly in FIG. 23, these hooks overlie the upper guide rod 222C so that plate 226C hangs from the upper rod and rests against the lower guide rod 224C. Extending from the rear of the plate 226C and between the upper 222C and lower 224C guide rods is a tab 230C.

A hole through the wall of alignment frame 180 has a conical countersink 232C. A differential screw mechanism 234C, which is essentially similar to that of the lever reduction machine previously described, extends between the conical countersink and the tab 230C and is loaded by a spring 236C. There is thus provided a coarse adjustment knob 238C and a fine adjustment knob 240C for adjusting the position of the plate 226C along the guide rods 222C and 224C. A similar construction is provided for adjusting the spacing of the A channel relative to the B channel. Accordingly, similar parts of that mechanism are given similar reference numerals, but with an "A" appended.

Mounted upon the angled wall 160 of optical head 88 is a bracket 242 (FIGS. 13, 18) which supports a vertically positioned lever reduction machine 92-4. The short end of the lever arm of this reduction machine is connected to one end of a horizontal double universal rod 144-4. The other end of rod 144-4 is connected to an adjustment tab 244 secured to alignment frame 180 and extending through a recess 246 in the angled wall 160. The function of lever reduction machine 92-4 is to impart rotational movement to the alignment frame 180, as will be later explained.

In order to impart translational motion along the x axis, there is positioned upon reference frame 158 a vertically positioned lever reduction machine 92-5 (FIG. 13). A similar machine 92-6 is mounted to provide translational motion along the y axis. As these lever machines are substantially identical, machine 92-5 will be described by particular reference to FIG. 22. As will be seen therein, a relatively short double universal rod 144-5 is connected horizontally between the short end of the lever arm 106 and the alignment frame 180, passing for that purpose through an opening 248 in the reference frame 158.

As has been previously mentioned, the cartridge 60 is supported above the optical head 88 by three circular blocks 168, 170, 172 having V-shaped recesses in their upper surfaces. These blocks are vertically adjustable by means of lever reduction machines 92-1, 2, 3. The linkage for achieving this relationship is illustrated in detail in FIG. 24, which illustrates the means for adjusting block 168 and is representative of all three linkages.

The pedestal 162 defines a recess 250 adjacent its left end so that it is, in effect, bifurcated. The two legs thus formed are secured to the reference frame 158 by means of screws 252. Extending into the recess 250 are an upper 254 and a lower 256 leaf spring. These leaf springs are parallel to one another and are secured at their right ends by means of an upper clamping bar 258 and a lower clamping bar 260 mounted in respective recesses 262, 264 of the pedestal 162 and secured by screw 266. Mounted on the cantilevered left ends of the springs 254, 256 by means of slots 268, 270 is a support block 272 upon which the circular block 168 is mounted. Extending into the recess 250 to the right of the support block 272 is a shoulder 274 which underlies the short end of the lever arm 106 of lever reduction machine 92-1. These elements are interconnected by means of a vertical, double universal rod 144-6.

In order to sense accurately the position of the cartridge 60, there are provided a plurality of sensors which may be, for example, of the capacitive type having an electrical readout. Two such sensors 276, 278 are illustrated in FIGS. 8 and 13 mounted on a bracket 280.

B. Cartridge

Figure 29:
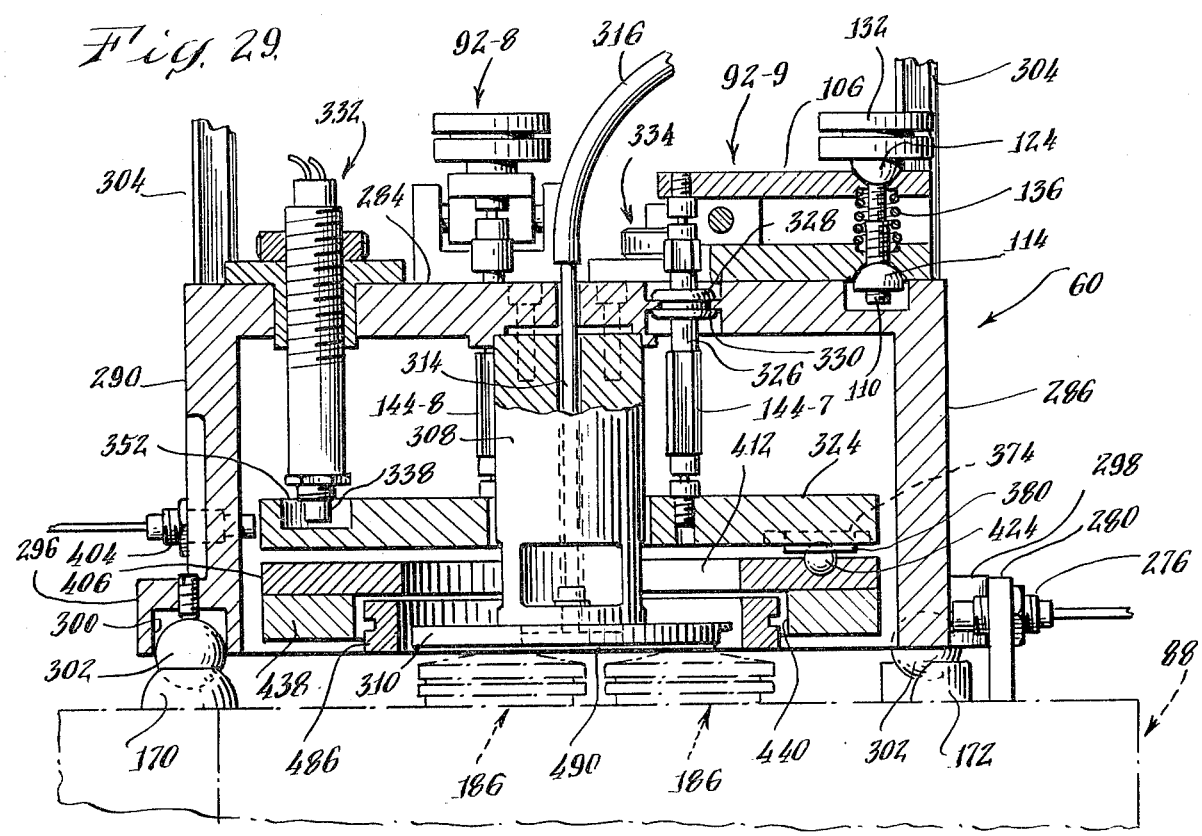
FIG. 29 is a cross-section taken substantially along the line 29—29 of FIG. 27.

The cartridge is best illustrated in FIGS. 27–34. As will be seen, it comprises an essentially rectangular external housing 282 having a top wall 284, four vertical sidewalls 286, 288, 290, 292, and an open bottom. Around the open lower edge of the housing 282 are three equally angularly spaced projections. One projection 294 extends outwardly from the sidewall 288. A second projection 296 extends outwardly from the sidewall 290, and a third projection 298 extends outwardly from the corner formed by sidewalls 286, 292. Within each of these projections and a portion of its corresponding sidewall, there is defined a recess 300 (FIG. 29). Secured within each of these recesses, so as to extend partially therefrom, is a support ball 302. When the cartridge is positioned on the optical head, each of these support balls 302 rests in one of the circular V-blocks 168, 170, 172.

Extending upwardly from the top wall 284 of the cartridge housing 282 are three vertical posts 304 surmounted by knobs 306. These are designed to serve as handles for manual removal of the cartridge and as supporting legs when the cartridge is inverted, as will be explained.

Depending downwardly inside the housing 282 from its top wall 284 is a pillar 308 (FIG. 29) which carries on its lower end a vacuum chuck in the form of a disk 310 (FIG. 26) having a central recess 312 which communicates by means of a vacuum tube 314 and an external vacuum hose 316 to a vacuum source (not shown). The resultant vacuum within the recess 312 causes the wafer workpiece 318 to adhere to the disk. It will be understood that the pillar 308 and disk 310 are fixedly mounted within the housing 22 so that there is no movement therebetween.

Also projecting outwardly from diagonally opposite corners of the open edge of the housing 282 are a pair of substantially rectangular projections 320, each of which carries a tubular plastic insert 322 therethrough. These inserts fit loosely over guide pins on the optical head to assist in positioning the cartridge thereon.

Mounted upon the top wall 284 are three lever reduction machines 92-7, 8, 9. As will be apparent from FIG. 27, these lever reduction machines are positioned such that their adjustment knobs 126, 132 are located outwardly from the center of the top wall 284. The short ends of their lever arms 106 are all connected in a similar fashion to an adjustable stage 324 in the form of a flat plate within the housing 282. In FIG. 29, there is illustrated the connection between lever reduction machine 92-9 and stage 324 and this is representative of the connection of the other lever reduction machines 92-7, 92-8. The short end of the lever arm 106 is connected to the upper end of a vertical double universal rod 144-7. The universal rod includes a cylindrical section 326 which passes through a sealing grommet 328 in an opening 330 in the top wall 284. The lever reduction machine 92-8 is similarly connected to stage 324 through a double universal rod 144-8 which is partially seen in FIG. 29, as is machine 92-7 through a rod which is not seen in the drawings. The vertical position of the stage 324 as established by the lever reduction machines 92-7, 8, 9 is monitored by three sensor gauge assemblies 332, 334, 336 which are mounted through the top wall 284 in order to support sensors 338 in close proximity to the stage.

The lower surface of stage 324 is illustrated in FIG. 32. As will be noted therein, the stage is essentially square with the exception of one corner which is cut away to provide a radial shoulder 340. One edge, the upper as viewed in FIG. 32, is notched to form an arcuate opening 342 through which extends a guide pin 344 which extends downward from the top wall 284 of the housing. A similar purpose is served by a circular opening 346 adjacent the opposite edge through which extends a similar guide pin 348. A central opening 350 in the stage surrounds the pillar 308 which supports the chuck disk 310. The upper surface of the stage 324 defines three circular recesses 352, 354, 356, which enclose the sensor gauges of each of the respective sensor gauge assemblies 332, 334, 336. Illustrative are recess 352 and gauge 338, as shown in FIG. 29. The stage 324 also defines three rectangular openings 358, 360, 362, which are displaced 120° relative to one another about the center of the stage. Also angularly displaced by 120° relative to one another are three other openings. These comprise a U-shaped opening 364. In the top edge of stage 324, as viewed in FIG. 32, are a pair of circular openings 366, 368. Radially inward of each of these openings is an oval recess 370, 372, 374. Mounted within each of these recesses is a rectangular bar 376, 378, 380. As is illustrated in the representative section of FIG. 31, each of these bars has a V-notch 382 formed therein which is aligned radially between the center of the stage 324 and the center of a respective opening 364, 366, 368. Mounted upon the top surface of the stage 324, and within the openings 364, 366, 368 are magnet assemblies 384, 386, 388. Magnet assembly 386 is typical and is illustrated in cross-section in FIG. 31. It comprises a substantially U-shaped mounting bracket 390 which is secured to stage 324 so as to overlie the opening 366. Mounted upon the underside of the bracket by means of a screw 392 are an iron washer 394 and a circular magnet 396 which extends into the opening 366.

As previously explained, the vertical position of the stage 324 within the housing is controlled by the lever reduction machines 92-7, 8, 9 on the top wall of the cartridge. The positioning of the stage in the horizontal plane is controlled by lever reduction machines 92-10, 11 and 12, which are vertically mounted on the exterior sidewalls of the cartridge. Machine 92-10 is mounted on sidewall 288 and machine 92-11 is mounted upon sidewall 290. FIG. 30 illustrates, in cross-section, the connection between lever reduction machine 92-11 and stage 324 and this is equally representative of machine 92-10. As will be noted therein, the short end of the lever arm of the lever reduction machine 92-11 is connected to a double universal rod 144-9 which passes through a sealing grommet 398 positioned in an opening 400 in the sidewall 290 so as to abut against the right-hand edge of the stage, as seen in the bottom view of FIG. 30. The lever reduction machine 92-10 is similarly mounted to actuate the lower edge of the stage (as so viewed) with a double universal rod 144-10. The remaining lever reduction machine 92-12 is mounted upon an angular projection 402 which projects from sidewall 292. A double universal rod 144-11 extends through the sidewall 292 and into engagement with the radial shoulder 140 of the stage 324 for rotational adjustment of the stage about its center. The position of stage 324 is monitored by means of three proximity sensors 404 which extend through sidewalls of the housing closely adjacent the edge of the stage.

Mounted against the bottom surface of stage 324 is an adapter plate 406 (FIG. 29). The upper surface of adapter plate 406, which faces the bottom surface of stage 324, is illustrated in FIG. 33. In other words, FIG. 33 illustrates the adapter plate as it would appear if removed from the bottom view of FIG. 30 and reversed. The outer edge of the adapter plate is somewhat irregularly shaped and includes a tubular insert 408 therethrough which receives the guide pin 344 and a similar tubular insert 410 which receives guide pin 348. The adapter plate defines a central circular opening 412 which is slightly larger than the diameter of the wafer chuck disk 310 (FIG. 29). The adapter plate 406 defines three rectangular openings 414, 416, 418 which are aligned, respectively, with the similarly shaped openings 358, 360, 362 in stage 324. Alignment between the adapter plate 406 and stage 324 is provided by means of balls 420, 422, 424 which rest, respectively, in the radial V-notches of rectangular bars 376, 378, 380.

The adapter plate 406 is held against the stage 324 by the magnetic force provided by three iron disks 426, 428, 430, which are mounted on the adapter plate in respective alignment with the magnet assemblies 384, 386, 388 on the stage 324. FIG. 31 illustrates the representative mounting of disk 428 upon a screw 432 which is threaded into the adapter plate 406. It is desirable that the iron disk not make physical contact with the magnet 396 to prevent possible misalignment due to dust particles between them. Accordingly, a stop nut 434 is threaded on the screw 432.

Mounted to the bottom of the adapter plate 406 by means of screws 436 (FIG. 30) is a circular grip ring 438. Grip ring 438 defines a central circular opening 440 which is interrupted about its periphery by three rectangular notches 442, 444, 446. These notches are aligned, respectively, with the openings 358, 360, 362 in stage 324. The lower surface of the grip ring defines rectangular recesses 448, each of which includes one of the notches. Mounted upon the grip ring 438, so as to extend upwardly through each of the notches 442, 444, 446, is a respective flexure gripper assembly 450, 452, 454. Each of these gripper assemblies is mounted within one of the recesses 448 by means of horizontal mounting feet 456 and screws 458 through elongated adjustment slots 460, as will be seen in FIG. 30.

The construction of the three flexure gripper assemblies is identical and FIG. 34 illustrates the representative construction of flexure gripper assembly 450. The mounting feet 456, previously described as mounting the flexure assembly in the recess 448, are lateral extensions of a generally U-shaped grip mount 462.

The top cross member of the grip mount 462 extends between a pair of vertical parallel legs 464. Depending downwardly from either side of the top of grip mount 462 are parallel blades 466. The blades 466 are secured at their upper ends to the grip mount by means of clamping bars 468 and screws 470. Mounted between the lower ends of the blades 466, by means of similar clamping bars 472 and screws 474, is a grip block 476. The lower, inward portion of grip block 476 includes a pair of spaced parallel jaws 478. Intermediate these jaws, the grip block 476 is bifurcated by means of a slot 480 terminating at a bore 482. Clamping action of the jaws 478 is secured by means of a screw 484. It will be noted that by this construction, the upper portion of each of the flexure gripper assemblies 450, 452, 454 extends through the openings 414, 416, 418 in adapter plate 406 and also through the openings 358, 360, 362 in stage 324. In this fashion, the jaws 478 are caused to be positioned very slightly below the lower surface of the adapter plate 406, as shown in FIG. 34.

Clamped between the jaws 478 of the flexure assemblies 450, 452, 454 is a mask ring 486. The flexure assemblies hold the ring firmly and constrain its position but allow for radial thermal expansion without deformation. The ring 486 is of rectangular cross-section but defines around its periphery a groove 488 which receives the lowermost of each of the jaws 478. Supported across the central opening of the mask ring 486 on its lower surface is a mask 490 (FIG. 29), which carries upon it the pattern to be replicated onto the surface of a wafer held on chuck disk 310. With the cartridge 60 mounted upon the optical head 88, the mask 490 is caused to be positioned a very slight distance away from the objective assemblies 186, as viewed in FIG. 29.

C. Geometry

Figure 35:
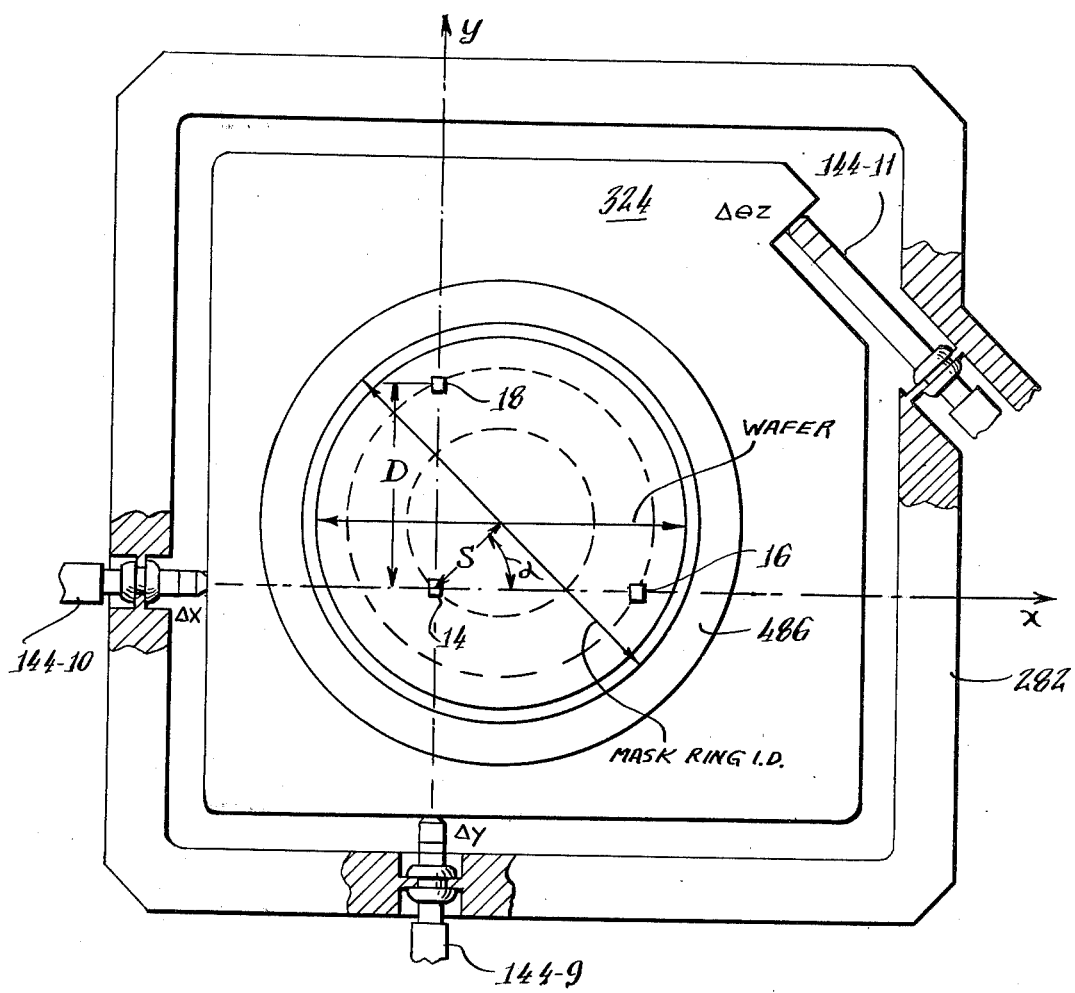
FIG. 35 is a schematic illustration of the cartridge assembly adjustment scheme.

FIG. 35 is a schematic diagram of the cartridge assembly geometry. The wafer is positioned inside the mask ring 486. This arrangement results in a small air space between the mask and wafer and helps to damp any tendency of the mask membrane to vibrate. Three position controls are illustrated. These provide translational and rotational motion in plane for the mask. The three z-motion controls are shown as circles in the corners of the stage 324. The location of the in-plane controls is chosen so that the center of rotation coincides with the virtual intersection of the x, y controls in order to minimize cross coupling. Similarly, the z controls are located on an isosceles triangle whose apex lies on the same diameter as the in-plane rotational control. Ideally, the z controls would act through points in the plane defined by the alignment targets 14, 16, 18. In practice, however, space constraints prevent this arrangement and the three controls are moved outward to the smallest distance practically possible. As a result of this movement, the z axis control motions differ from those of the alignment targets. Similar considerations determine the locations of the controls on the optical head. The practical effect of these changes is that the wafer space and control space are not coincident, although they bear a fixed relationship, to each other.

IV. Operation

In the following description of the operation of the method and apparatus of this invention, it is assumed that a wafer is employed which has previously been lithographed with at least one pattern, thus requiring alignment of a subsequent mask pattern with the previously applied pattern. If the wafer is unpatterned the lateral wafer alignment steps are omitted.

The cartridge 60 is removed from its position atop the optical head 88 as illustrated in FIG. 8, inverted and placed upon a working surface positioned by its post 304 and knobs 306. The vacuum hose 316 is connected to a source of vacuum and the prepatterned wafer 318 is mounted on the surface of the chuck disk 310 where it is retained by the vacuum. The wafer may be roughly prealigned in orthogonal and lateral directions as by means of flats along the edges of the wafer and the chuck disk. In one embodiment, this permits alignment to ±125 μm. After so positioning the wafer, the cartridge 60 is reinverted and positioned on the optical head 88. The support balls 302 on the cartridge are positioned within the V recesses of the respective circular blocks 168, 170, 172 on the optical head.

The operator now makes coarse lateral and vertical alignments. This is done while observing the wafer surface through the microscope 90, through each optical channel in turn. Thus, the disk 210 of the channel selector 68 is positioned alternately to align the microscope with channels A, B and C. Vertical alignment is then roughly achieved by operation of the lever reduction machines 92-1, 92-2, 92-3 mounted upon the respective pedestals 162, 164, 166. This vertically positions the respective blocks 168, 170, 172 until the desired fringe appearance is perceived by the operator. In more detail, the lever reduction machine nearest each channel objective is used sequentially until fringes are perceived in all three channels with no further adjustment. These three lever reduction machines interact. The pure manual iterative cycle is speeded up by the use of three proximity sensor gauges associated with the optics-to-cartridge (wafer) spacing. The three gauges are read after each channel is adjusted independently in a predetermined order. These nine readings are used to invert and separate the lever reduction machine interactions to yield three sequential gauge settings. The gauges are set, one gauge by each lever reduction machine to produce fringes in one cycle instead of many manual iterations.

Coarse lateral adjustments are made in the same fashion, except that lever reduction machines 92-4, 92-5 and 92-6 are utilized. These adjustments act upon the alignment frame 180 as is illustrated in detail in FIG. 22. As viewed in FIG. 13, lever reduction machine 92-5 laterally positions the alignment frame 180 by acting through the axis containing optical axes A and B. Lever reduction machine 92-6 similarly positions the alignment frame 180 acting through the axis containing optical axes B and C. Translational positioning is achieved by lever reduction machine 92-4 which translates the frame 180 about the axis Z which is illustrated in the schematic illustration of FIG. 35. In addition to this lateral alignment by means of the alignment frame 180, the spacing between the optical axes A and B and between the optical axes B and C is adjusted by means of differential screw mechanisms 234a and 234c as illustrated, respectively, in FIGS. 18 and 19. These adjustments cause the respective objective and illuminating assemblies 186a, 186c to be shifted along the guide rods 222a, 222c so that the respective microscope objectives are also shifted relative to objective 186B.

These lateral and translational adjustments of the alignment frame 180 and objective assemblies 186a, 186c are carried out while observing the respective targets 14, 16, 18 on the wafer surface so as to achieve the single image effect illustrated in FIG. 5 at each target position. There are only six degrees of freedom between the wafer and optics head while there are three targets with three degrees of freedom with respect to each channel. This gives nine degrees of freedom. To avoid over constrained alignment only six degrees of freedom are used. Z is set at all three targets for three of the degrees of freedom. The other three are lateral or in wafer plane alignment. Target 14 is aligned in x and y by lever reduction machines 92-5 and 92-6. Target 18 is aligned in x, corresponding to an angular rotation about target 14, by lever reduction machine 92-4. Target 16 is not aligned laterally. After these coarse lateral and vertical alignments, the operator returns to the lever reduction machines 92-1, 92-2, 92-3 and makes fine vertical adjustments which can now be achieved to an accuracy of less than 0.1 μm. Similarly, he thereafter returns to the lateral adjusting lever reduction machines 92-4, 5, and 6 and the differential screws 234a and c which now provide adjustments to the same degree of accuracy.

When these alignment steps have been completed, the axes of the microscope objectives in the optical head 88 have been aligned with the targets 14, 16 and 18 on the wafer surface in (x, y, z), (z) and (x, z) respectively so that the patterned wafer and optical reference channels are now aligned in the desired six degrees of freedom. At this time the electrical outputs of the proximity sensors are set to zero. Channel A is now fine aligned to target 18 in y by the use of only lever reduction machine 92-5. The optics lateral proximity sensors are read and used to calculate the small y optics motion required. This quantity $y_w$ is the difference between the separation of the A-B channel axes and wafer targets 14–18. $y_w$ is positive if the target separation is larger than the channel separation. Channel B is now fine aligned to target 14 in y by the use of lever reduction machines 92-5. The patterned wafer and optical reference have been returned to alignment.

The next step is to increase the distance between the wafer and the optical objectives. This is accomplished by raising the cartridge assembly relative to the optical head 88 by a small amount, typically 50 μm, employing the lever reduction machines 92-1, 2, and 3 and the sensors. As illustrated schematically in FIGS. 1 and 2, this repositions the wafer 10 from the position illustrated in FIG. 1 to the position illustrated in FIG. 2. Thereafter, cartridge 60 is once again removed from the optical head 88, inverted and placed on the work surface.

The mask, which for purposes of this description will be considered to be opaque to visible light, has been previously fabricated and is mounted on the mask ring 486 which is carried by the flexure gripper assemblies 450, 452, 454. The assembled combination of the mask ring 486, grip ring 438, and adapter plate 406 is mounted upon the stage 324. The balls 420, 422, 424, which are carried by the adapter plate 406, are positioned within the radial V notches 382 of the bars 376, 378, 380. The iron disks 426, 428, 430 extend into the openings 364, 366, 368 into closely spaced relationship from the magnets 396, which maintain the component assembled.

The cartridge 60 with the mask now in place and spaced nominally 50 μm from the wafer is now inverted and replaced upon the optical head 88 as previously described. The proximity sensors are then checked by the operator to insure that there has been no variation in the relative positions of cartridge 60 and optical head 88.

The next portion of the procedure is to align the mask to the optical axes. This is accomplished by observation sequentially through each of the optical channels in much the same manner as previously described relative to wafer adjustment. However, vertical alignment of the mask is now controlled by the lever reduction machines 92-7, 8, 9 which vertically adjust the position of the stage 324 (FIG. 29). Unlike the optics-to-wafer alignment there is very little lever reduction machine interaction so that these controls are set manually. Similarly, lateral adjustment is provided by the lever reduction machines 92-10, 11, and 12, which laterally and translationally position the stage 324 and are illustrated in FIG. 30.

The coarse adjustments are first made as previously explained. Thereafter, fine vertical alignment is made which brings the vertical spacing to an accuracy of 0.1 μm. The lateral controls are then also finely aligned to the same accuracy and the mask sensor gauges are brought to zero. In analogy with the wafer-to-optical reference alignment the mask-to-optical alignment is in (x, y, z), (z) and (x, z) at channels B, C, and A corresponding to targets at 14, 16 and 18 respectively. Channel A is fine aligned to target 18 in y by the use of only lever reduction machine 92-11. The mask lateral proximity sensors are read and used to calculate the small y mask motion required. This quantity $y_m$ is the difference between the separation of the A-B channel axes and mask targets 14 and 18. $y_m$ is positive if target separation is larger than the channel separations. Channel B is now fine aligned to target 14 in y by the use of lever reduction machine 92-11. The mask has now been returned to alignment with respect to the optics. At this time the mask and wafer are parallel and separated by exactly 50 μm. The patterns are in angular alignment with mask and wafer targets 14 (B channel) over each other.

Next a new mask-to-wafer separation is calculated. The wafer pattern is slightly larger than the mask because the point X-ray source projects the mask pattern onto the wafer with a magnification $=1+(z/H)$ where z is the mask-to-wafer gap and H is the distance from the X-ray source to the mask. The mask-to-wafer gap is adjusted from the nominal z=50 μm gap to account for small scale changes (small magnification changes) such as those due to temperature changes and wafer processing. The desired gap is $$z = H(\Delta/D)$$

where D is the nominal separation between targets 14 and 18 and $$\Delta = y_w - y_m$$

is the exact (positive) difference between the corresponding wafer and mask target separations. The three mask separation gauges 332, 334 and 336 are zeroed. Mask separation lever reduction machines 92-7, 92-8 and 92-9 are used to set these three gauges to z−50 μm.

Next the mask center is aligned to the wafer center. The three mask lateral gauges 404a, b and c (FIG. 27) are zeroed. Lever reduction machines 92-10 and 92-11 are carefully adjusted by the use of these three gauges to translate the mask small distances Δx and Δy toward the alignment center where $$\Delta x = S(\Delta/D) \cos \alpha$$

$$\Delta y = S(\Delta/D) \sin \alpha$$

S is the nominal distance from the desired mask-wafer alignment center to the B channel target 14 and α is the angle between the x axis, target 14 and the desired alignment center. The desired alignment center is at the line through the X-ray point source that is perpendicular to the mask. In our example α=45 degrees. The alignment center is at the wafer center as shown in FIG. 35. After the foregoing steps have been accomplished, the cartridge 60 is removed from the optical head 88 and is transferred to the X-ray exposure station as shown schematically in FIG. 3, where the wafer is exposed to an X-ray source 26 through the mask 24.

It is believed that the many advantages of this invention will now be apparent to those skilled in the art. By its use, a very difficult problem is overcome—namely, that of aligning to extremely crucial and close tolerances, the pattern of an opaque mask to the previously existing pattern on a silicon wafer. It will also be apparent to those skilled in the art that a number of variations and modifications may be made in this invention without departing from its spirit and scope. Accordingly, the foregoing description is to be construed as illustrative only, rather than limiting. This invention is limited only by the scope of the following claims.

I claim:

1. The method of aligning a lithographic mask to a substrate wafer which comprises:
   providing a plurality of alignment targets on one surface of each of said mask and wafer;
   providing a plurality of microscope optical channels positioned to view portions of a reference plane;
   positioning said wafer with its alignment surface in said reference plane and with each of its alignment targets aligned with the optical axis of a different one of said optical channels;
   displacing said wafer from said reference plane to an exposure plane parallel thereto while retaining its alignment relative to said optical axes;
   positioning said mask in said reference plane with each of its alignment targets aligned with a different one of said optical channels; and
   retaining the alignment between wafer and mask for subsequent exposure of said wafer through said mask.

2. The method of aligning a lithographic mask to a substrate wafer which comprises:
   providing a plurality of alignment targets on one surface of each of said mask and wafer;
   providing a plurality of microscope optical channels positioned to view portions of a reference plane;
   positioning said wafer with its alignment surface in said reference plane;
   aligning the optical axis of each of said optical channels with a different one of the targets on said wafer;
   displacing said wafer from said reference plane to an exposure plane parallel thereto while retaining its alignment relative to said optical axes;
   placing said mask in said reference plane;
   positioning said mask to align each of its alignment targets with a different one of said optical axes, without changing the alignment of said axes; and
   retaining the alignment between wafer and mask for subsequent exposure of said wafer through said mask.

3. The method of claim 1 or 2 wherein each of said plurality of targets and plurality of channels comprises at least three.

4. The method of claim 1 or 2 wherein said subsequent exposure includes transporting the aligned mask and wafer to an exposure station.

5. The method of aligning a lithographic mask to a substrate wafer which comprises:
   providing a plurality of alignment targets on one surface of each of said mask and wafer;
   providing an optical head substantially enclosing a plurality of optical channels positioned to view portions of a reference plane;

providing a cartridge assembly mounted in a first position on said optical head to support said one surface of said wafer in said reference plane;

aligning the optical axis of each of said optical channels with a different one of the targets on said wafer;

displacing said cartridge assembly relative to said optical head to a second position whereby said one surface of said wafer lies in a plane parallel to, but spaced a known distance from, said reference plane;

removing said cartridge assembly from said optical head;

mounting said mask on said cartridge assembly parallel to said wafer and spaced said known distance from said one surface of the wafer;

repositioning said cartridge assembly to said second position on said optical head whereby said mask lies in said reference plane;

adjusting the position of said mask relative to said cartridge assembly to align each of the targets on said mask to a separate one of the optical axes of said optical channels;

removing said cartridge assembly, including said mask and wafer while retaining the alignment of said mask and wafer, to an exposure station; and exposing said wafer to activating radiation through said mask, whereby a pattern on said mask is replicated onto said wafer.

6. The method of claim 5 wherein said mask is optically opaque.

7. The method of claim 5 or 6 wherein said radiation is X-radiation.

8. Apparatus for aligning the pattern on a projection mask to a previously applied pattern on a wafer which comprises:

means for defining a plurality of microscope optical channels, each positioned to view a different target area in a common reference plane;

means for independently positioning each of said channels to align its optical axis with a preselected target in a target area;

means for supporting a wafer with its pattern in said reference plane, portions of said pattern defining a first set of preselected targets;

means for displacing said wafer from said reference plane to an exposure plane parallel to said reference plane while retaining the alignment of the wafer pattern with said optical axes;

means for supporting said projection mask on said wafer supporting means with its pattern in said reference plane; portions of said mask pattern defining a second set of preselected targets;

means for positioning said projection mask, within said reference plane, to align each target of said second set with a different one of said optical axes; and means for retaining the alignment between wafer and mask for subsequent exposure of said wafer through said mask.

9. The apparatus of claim 8 wherein said channel positioning means comprises:

means for viewing said reference plane through a selected one of said optical channels.

10. The apparatus of claim 9 wherein said viewing means comprises:

an eyepiece; and channel selector means for optically coupling said eyepiece selectively to each of said channels.

11. The apparatus of claim 8 or 9 wherein said target area comprises a two dimensional figure and said target comprises the geometric center of said figure.

12. Apparatus for aligning the pattern on a projection mask to a pattern on a wafer which comprises:

means for defining a plurality of microscope optical channels, each being positionable for alignment with a preselected respective one of a plurality of targets on a common reference surface;

means for supporting a wafer with its pattern on said reference surface, portions of said pattern defining a first set of targets;

means for displacing said wafer from said reference surface to an exposure surface parallel to, and at a predetermined distance away from, said reference surface while retaining the alignment of the first set of targets with said respective optical axes;

means for securing said projection mask to said wafer supporting means with its pattern on said reference surface, portions of said mask pattern defining a second set of targets; and means for shifting said projection mask relative to said wafer supporting means within said reference surface for bringing the respective targets of said second set into alignment with the respective aligned optical axes of said optical channels whereby said projection mask is brought into desired alignment with said displaced wafer.

13. The apparatus of claim 12 wherein each of said reference and exposure surfaces is planar.

* * * * *